United States Patent
Stiblert et al.

(10) Patent No.: US 8,822,879 B2
(45) Date of Patent: Sep. 2, 2014

(54) WRITING APPARATUSES AND METHODS

(75) Inventors: Lars Stiblert, Göteborg (SE); Torbjörn Sandström, Pixbo (SE); Jarek Luberek, Mölndal (SE); Tomas Lock, Göteborg (SE)

(73) Assignee: Mycronic AB, Taby (SE)

( * ) Notice: Subject to any disclaimer, the term of this patent is extended or adjusted under 35 U.S.C. 154(b) by 0 days.

(21) Appl. No.: 12/805,708

(22) Filed: Aug. 16, 2010

(65) Prior Publication Data

US 2010/0308024 A1    Dec. 9, 2010

Related U.S. Application Data

(62) Division of application No. 11/586,612, filed on Oct. 26, 2006.

(60) Provisional application No. 60/730,009, filed on Oct. 26, 2005, provisional application No. 60/776,919, filed on Feb. 28, 2006.

(51) Int. Cl.
*B23K 26/00* (2014.01)

(52) U.S. Cl.
USPC .............................. 219/121.61; 219/121.68

(58) Field of Classification Search
USPC ............. 219/121.61, 121.67, 121.68, 121.69, 219/121.7, 121.71
See application file for complete search history.

(56) References Cited

U.S. PATENT DOCUMENTS

| | | | | |
|---|---|---|---|---|
| 4,131,782 A | * | 12/1978 | Einstein et al. | 219/121.85 |
| 4,322,600 A | * | 3/1982 | Crahay | 219/121.7 |
| 4,377,736 A | * | 3/1983 | Daunt et al. | 219/121.68 |
| 4,429,211 A | * | 1/1984 | Carstens et al. | 219/121.63 |
| 4,533,813 A | * | 8/1985 | Rayburn et al. | 219/121.68 |
| 4,628,179 A | * | 12/1986 | Crahay | 219/121.68 |
| 4,652,722 A | | 3/1987 | Stone et al. | |
| 4,758,705 A | * | 7/1988 | Hertzel et al. | 219/121.6 |
| 4,806,731 A | * | 2/1989 | Bragard et al. | 219/121.69 |
| 4,905,025 A | | 2/1990 | Sakamoto et al. | |
| 4,977,458 A | | 12/1990 | Granger et al. | |
| 5,065,193 A | * | 11/1991 | Saitoh et al. | 399/324 |
| 5,147,680 A | | 9/1992 | Slysh | |
| 5,247,155 A | | 9/1993 | Steen et al. | |

(Continued)

FOREIGN PATENT DOCUMENTS

| | | |
|---|---|---|
| EP | 1 132 776 | 9/2001 |
| EP | 1 645 657 | 4/2006 |

(Continued)

OTHER PUBLICATIONS

U.S. Office Action from U.S. Appl. No. 11/586,612, dated Nov. 1, 2010.

(Continued)

*Primary Examiner* — John Wasaff

(74) *Attorney, Agent, or Firm* — Harness, Dickey & Pierce, P.L.C.

(57) ABSTRACT

Patterns are written on workpieces, such as, glass sheets and/or plastic sheets used in, for example, electronic display devices such as LCDs. The workpiece may be larger than about 1500 mm may be used. An optical writing head with a plurality of writing units may be used. The workpiece and the writing head may be moved relative to one another to provide oblique writing.

14 Claims, 31 Drawing Sheets

(56) References Cited

U.S. PATENT DOCUMENTS

| | | | |
|---|---|---|---|
| 5,278,385 A | 1/1994 | Gerome et al. | |
| 5,296,036 A | 3/1994 | Matsuyama et al. | |
| 5,402,155 A | 3/1995 | Hatayama et al. | |
| 5,495,279 A | 2/1996 | Sandstrom | |
| 5,535,672 A | 7/1996 | Kuwahara | |
| 5,663,783 A | 9/1997 | Ueda | |
| 5,668,588 A | 9/1997 | Morizumi et al. | |
| 5,868,075 A * | 2/1999 | Kline et al. | 101/467 |
| 6,018,383 A | 1/2000 | Dunn et al. | |
| 6,066,830 A | 5/2000 | Cline et al. | |
| 6,130,405 A * | 10/2000 | Loringer | 219/121.71 |
| 6,151,109 A | 11/2000 | Bromssen et al. | |
| 6,180,325 B1 | 1/2001 | Gelbart | |
| 6,542,178 B2 | 4/2003 | Miyagawa et al. | |
| 6,586,702 B2 | 7/2003 | Wiener-Avnear et al. | |
| 6,625,181 B1 | 9/2003 | Oshemkov et al. | |
| 6,717,756 B2 | 4/2004 | Berman et al. | |
| 6,822,192 B1 | 11/2004 | Young | |
| 6,847,433 B2 | 1/2005 | White et al. | |
| 6,900,826 B2 | 5/2005 | Williams et al. | |
| 7,289,137 B2 | 10/2007 | Liebig et al. | |
| 2001/0046053 A1 | 11/2001 | Hill | |
| 2002/0143435 A1* | 10/2002 | Terada et al. | 700/245 |
| 2002/0180988 A1 | 12/2002 | Johnston et al. | |
| 2003/0218667 A1 | 11/2003 | Williams et al. | |
| 2004/0081499 A1 | 4/2004 | Sasaki | |
| 2004/0150707 A1 | 8/2004 | Stiblert et al. | |
| 2005/0018255 A1 | 1/2005 | Nakaya et al. | |
| 2005/0052464 A1 | 3/2005 | Okuyama | |
| 2005/0082496 A1 | 4/2005 | Bjuggren et al. | |
| 2005/0104952 A1 | 5/2005 | Haushahn et al. | |
| 2005/0104953 A1 | 5/2005 | Suzuki et al. | |
| 2006/0092199 A1 | 5/2006 | White et al. | |

FOREIGN PATENT DOCUMENTS

| | | |
|---|---|---|
| EP | 1 582 928 | 2/2008 |
| JP | 60-227988 | 11/1985 |
| JP | 7-72401 | 3/1995 |
| JP | 7-101032 | 4/1995 |
| JP | 9-27447 | 1/1997 |
| JP | 09052186 A * | 2/1997 |
| JP | 9-185196 | 7/1997 |
| JP | 10-256476 | 9/1998 |
| JP | 2001-092143 | 4/2001 |
| JP | 2001-179928 | 7/2001 |
| JP | 2001-523167 | 11/2001 |
| JP | 2001-524893 | 12/2001 |
| JP | 2002-098925 | 4/2002 |
| JP | 2002-311597 | 10/2002 |
| JP | 2002-351086 | 12/2002 |
| JP | 2002-543607 | 12/2002 |
| JP | 2003-084447 | 3/2003 |
| JP | 2003-195470 | 7/2003 |
| JP | 2003-223008 | 8/2003 |
| JP | 2003-241395 | 8/2003 |
| JP | 2004-098559 | 4/2004 |
| JP | 2004-175078 | 6/2004 |
| JP | 2004-191985 | 7/2004 |
| JP | 2004-524706 | 8/2004 |
| JP | 2004-525404 | 8/2004 |
| JP | 2004-317545 | 11/2004 |
| JP | 2004-351938 | 12/2004 |
| JP | 2004-354611 | 12/2004 |
| JP | 2005-43555 | 2/2005 |
| JP | 2005-55524 | 3/2005 |
| JP | 2005-148729 | 6/2005 |
| JP | 2005-182007 | 7/2005 |
| JP | 2005-292214 | 10/2005 |
| JP | 2007-512551 | 5/2007 |
| JP | 2009-514012 | 4/2009 |
| JP | 4-501798 | 7/2010 |
| JP | 04-504932 | 7/2010 |
| WO | WO 9006033 | 5/1990 |
| WO | WO 9850196 | 11/1998 |
| WO | WO 9852345 | 11/1998 |
| WO | WO 00/62324 | 10/2000 |
| WO | WO 0067291 | 11/2000 |
| WO | WO 02082598 | 10/2002 |
| WO | WO 03/033271 | 4/2003 |
| WO | WO 03/081966 | 10/2003 |
| WO | WO 2005/007927 | 1/2005 |

OTHER PUBLICATIONS

U.S. Office Action dated May 10, 2011 for U.S. Appl. No. 11/711,895.
U.S. Office Action dated May 3, 2011 for U.S. Appl. No. 11/586,612.
Eran Elizur et al., "Printing Methods for Flat-Panel Display Manufacturing," Journal of Graphic Technology 1.2, Aug. 2003.
International Preliminary Report on Patentability dated Aug. 19, 2008 for International Application No. PCT/EP2007/001725.
U.S. Office Action mailed Jun. 17, 2010 for U.S. Appl. No. 11/586,614.
Office Action issued in related U.S. Appl. No. 11/711,895 dated Aug. 30, 2010.
Office Action issued in related U.S. Appl. No. 11/586,614 dated Dec. 22, 2010.
Japanese Office Action dated Aug. 30, 2011, issued in Japanese Patent Application No. 2008-537641.
Japanese Office Action dated Aug. 30, 2011, issued in Japanese Patent Application No. 2008-537640.
Japanese Office Action dated Feb. 21, 2012 issued in Japanese Application No. 2008-556711.
Chinese Office Action dated Dec. 21, 2011 issued in Chinese Application No. 200680049107.9.
U.S. Office Action dated Sep. 28, 2011, issued in co-pending U.S. Appl. No. 11/586,612.

* cited by examiner

FIG. 1A
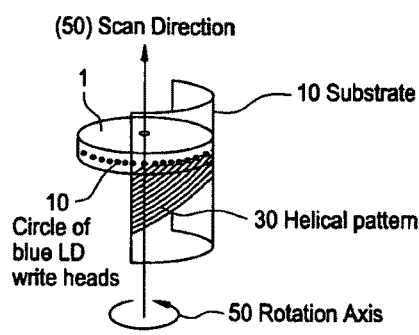
FIG. 1B     FIG. 1C
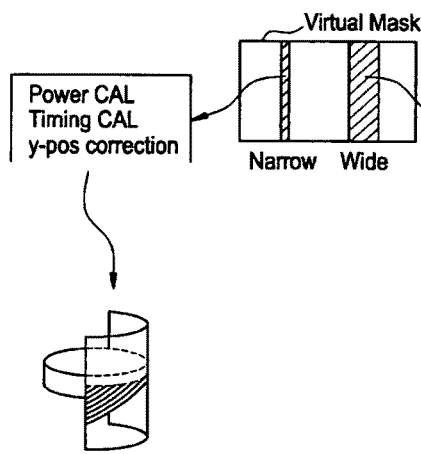
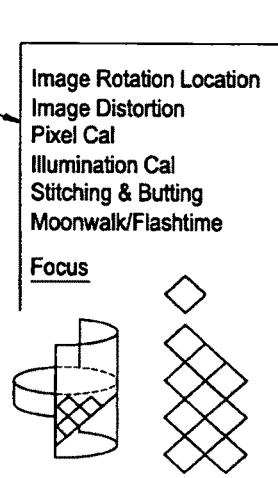

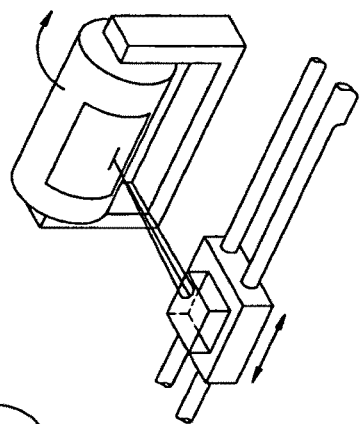
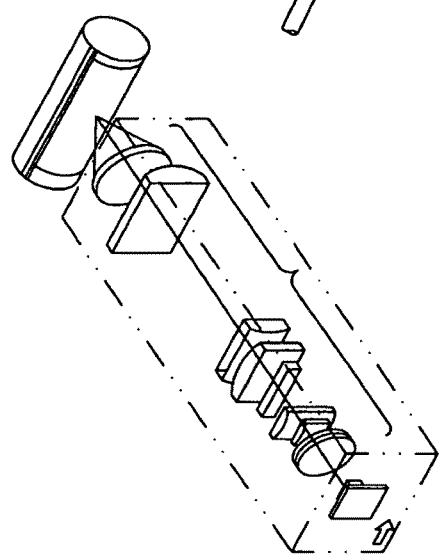

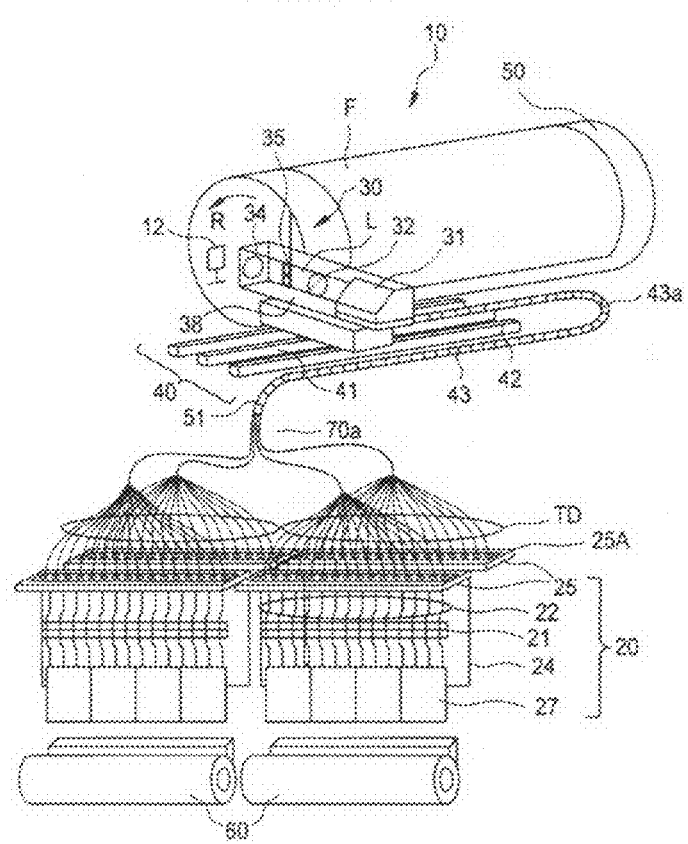

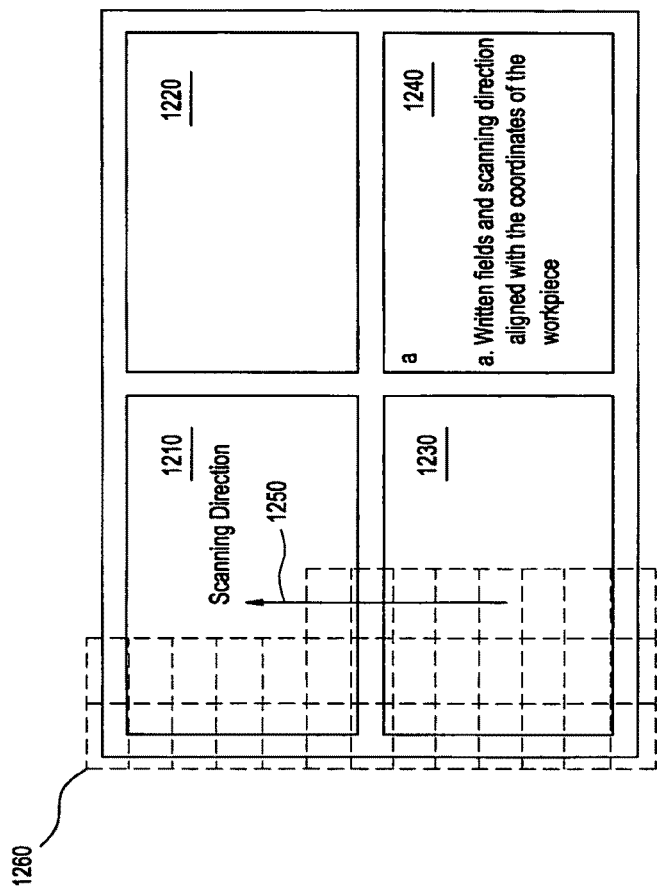

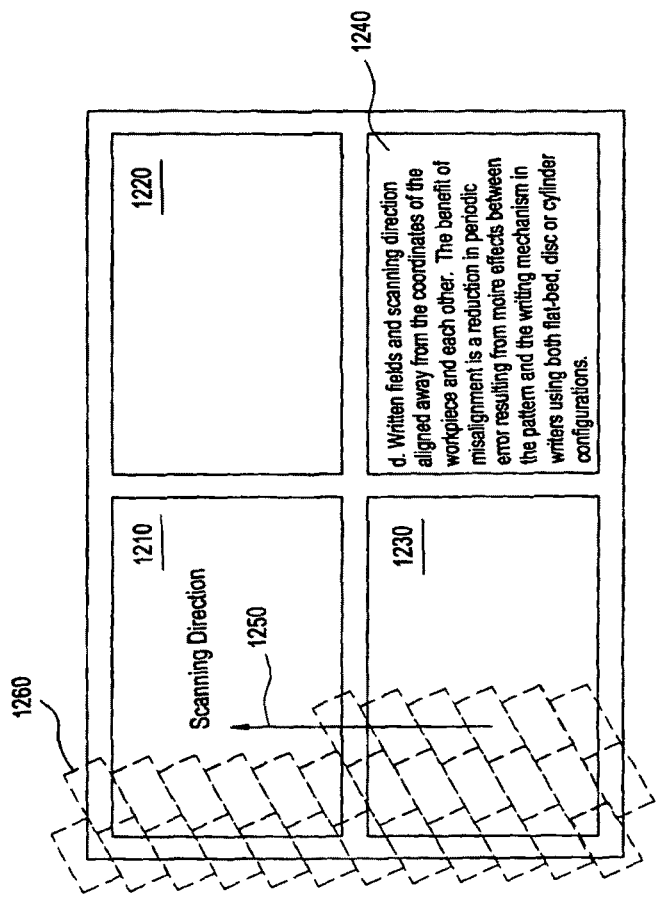

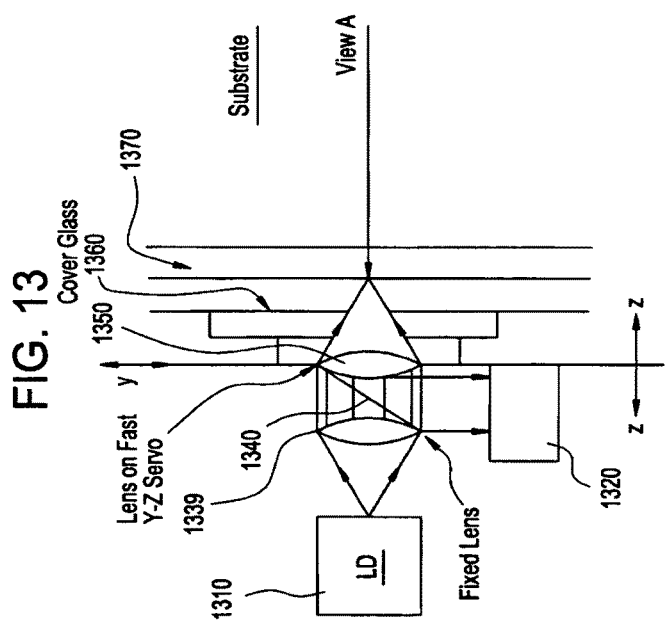

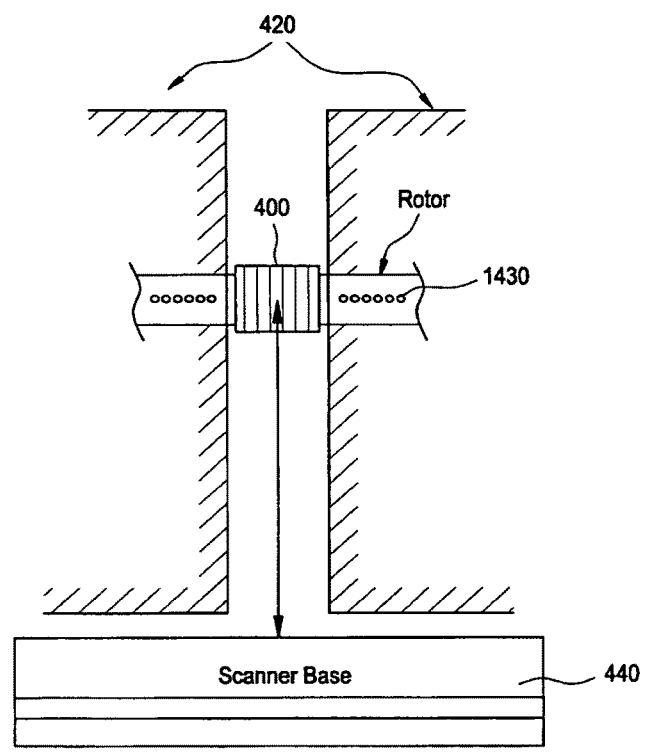

US 8,822,879 B2

WRITING APPARATUSES AND METHODS

PRIORITY STATEMENT

This non-provisional U.S. patent application is a divisional application of 11/586,612, filed on Oct. 26, 2006, which claims priority to provisional U.S. patent application Ser. Nos. 60/730,009, filed on Oct. 26, 2005 and 60/776,919, filed on Feb. 28, 2006, the entire contents of each of which are incorporated by reference.

BACKGROUND

Conventional pattern generation systems for patterning large workpieces also create the pattern in stripes, swaths or rectangles. The boundaries between them, commonly referred to as butting or stitching boundaries create undesirable artifacts that may be visible in the final pattern. U.S. Pat. No. 5,495,279, the entire contents of which are incorporated herein by reference, illustrates a conventional method and apparatus for exposing substrates.

Extremely high throughput, for example in the range of about 0.05 $m^2$/s through about 0.2 $m^2$/s, combined with the large size of the workpieces, (e.g., in a range of about 5 $m^2$ through 10 $m^2$, and even 20 $m^2$ or more), high optical resolution (e.g., in the range of about 3 microns through about 5 microns, and even down to 1 micron) and a sensitivity to "Mura" (visible striping or banding) defects creates a need to control certain errors to 50 nm or better. Conventional pattern generators, however, are unable to do so because merely scaling up conventional pattern generation techniques fails to achieve the required error control.

FIGS. 1D-1F illustrate example conventional pattern generators as disclosed in U.S. Pat. No. 6,542,178, U.S. Patent Publication No. 2004/0081499 and 2005/0104953, respectively, the entire contents of each of which are incorporated herein by reference.

FIG. 1D illustrates a drum plotter as disclosed in U.S. Pat. No. 6,542,178. As shown in FIG. 1D, the drum plotter includes a single writing unit writing optically on a rotating drum while moving along the axis of the drum. In the drum plotter of FIG. 1D, however, only the drum holding the workpiece, but not the single writing unit, is capable of rotating. Moreover, the drum plotter of FIG. 1D includes only a single exposure head, and each of the drum and the single writing unit are only capable of a single type of movement. That is, the drum is only capable of rotating, whereas the single writing unit is only capable of linear translational movement.

FIG. 1E illustrates an optical system as disclosed in U.S. Patent Publication No. 2004/0081499 for thermal transfer printing on glass substrates for LCD production. As shown in FIG. 1E, the optical system also includes a single optical writing unit moving along the axis of the rotating cylindrical workpiece holder. In the optical system of FIG. 1E, however, only the cylindrical workpiece, but not the single optical writing unit, is capable of rotating. Moreover, the optical system of FIG. 1E includes only a single exposure head, and each of the cylindrical workpiece and the single optical writing unit are only capable of a single type of movement. That is, the cylindrical workpiece is only capable of rotating, whereas the single optical writing unit is only capable of linear translational movement.

FIG. 1F illustrates a system writing optically on a rotating drum using multiple light sources coupled with fibers to a single writing unit and having the power of the light sources calibrated against a single detector as disclosed in U.S. Patent Publication No. 2005/0104953. As shown in FIG. 1F, the optical system also includes a single writing unit moving along the axis of the rotating drum. In the optical system of FIG. 1F, as in the optical systems of FIGS. 1D and 1E, only the cylindrical workpiece, but not the single optical writing unit, is capable of rotating. Moreover, the optical system of FIG. 1F includes only a single exposure head, and each of the cylindrical workpiece and the single optical writing unit are only capable of a single type of movement. That is, the cylindrical workpiece is only capable of rotating, whereas the single optical writing unit is only capable of linear translational movement.

The optical system of FIG. 1F further includes a photodetector for detecting the quantity of light emitted from the single optical writing unit. This photo detector, however, only detects quantity of light from the single optical writing unit.

Moreover, in each of FIGS. 1D-1F, the direction of rotation is parallel with one axis of the pattern and workpiece, while being perpendicular to the other axis of the pattern and workpiece.

FIG. 12A shows an example alignment of movements, produced by pattern generators such as those discussed above. Referring to FIG. 12A, three different coordinate systems are present. The first is the coordinate system of the pattern. In this example the patterns are display devices 1210, 1220, 1230 and 1240 formed on the workpiece glass. The second coordinate system is that of the writing mechanism 1260. In this example, the writing mechanism 1260 is an SLM. The third coordinate system is formed by the direction 1250 of movement of the writing mechanism 1260. In FIG. 12A, the three coordinate systems are aligned with each other. Arrow 1250 indicates the rotation direction of the workpiece relative to the pattern of the writing mechanism 1260. In the example shown in FIG. 12A, the rotation direction is parallel to a side of the writing mechanism (e.g., an SLM chip).

Conventional art direct write machines exposing liquid crystal display (LCD) workpieces using conventional pattern generators have write times of about twenty-four hours (one day). In these conventional pattern generators, writing width may be increased to reduce write time. However, this may require a larger number of optical channels and/or lenses, which may increase cost and/or complexity of the pattern generator. The speed at which the stage is moved may also be increased. However, controlling mechanical motion and/or vibration may be more difficult as stage speed increases. For example, an increase in speed and mass along with a decrease in application time may result in greater vibrations and/or resonances at higher frequencies in the mechanical structures. In addition, control and/or mechanical systems may not settle properly before writing a new stripe. Moreover, increased speed, vibration and/or a number of optical channels may increase cost and/or complexity of conventional pattern generators.

SUMMARY OF THE INVENTION

Example embodiments describe mechanical, optical and/or calibration methods and apparatuses, which may alone or in combination simultaneously provide increased (e.g., high or relatively high) throughput, resolution and/or image quality on larger (e.g., large, very large or relatively large) workpieces.

Example embodiments relate to methods and apparatuses for patterning a workpiece, for example, an increased throughput and/or higher precision pattern generator for patterning multiple types of workpieces.

Example embodiments may be applied to other workpieces with similar design and/or requirements, such as other types of displays (e.g., OLED, SED, FED, "electronic paper" and the like). The workpieces shown in the application are cut sheets, but may also be continuous sheets of glass, plastic, metal, ceramic, etc. Some example embodiments may also be used to process solar panels.

Example embodiments are discussed herein with respect to standard photolithography, for example, exposure of a resist, however, at least some example embodiments may also be applied to patterning by laser ablation, thermal pattern transfer and/or other light-induced surface modification.

In at least some examples embodiments, a conventional "scan and retrace" method may be replaced by a rotating scan method, according to example embodiments. In addition, or alternatively, a pattern generator including a rotor scanner may replace a scan and retrace pattern generator. The rotation of the rotor scanner pattern generator, according to at least some example embodiments, may have a higher constant speed than the scanning speed in the conventional "scan and retrace" method. A plurality (e.g., at least two) of optical writing units may be arranged, for example, on the rim of a rotating disc or ring, and may emit a beam in a radial direction.

In at least some examples embodiments, at least one of a holder for holding a workpiece and at least one writing head may be rotated. The at least one writing head may include a plurality of exposure beams having a wavelength for exposing a layer of electromagnetic radiation sensitive material covering at least a portion of a surface of a workpiece, and may radiate in a radial direction. At least one of the holder and the at least one writing head may be moved translationally so that the at least one writing head and the holder move relative to each other, and form a trajectory of exposed area of the workpiece.

At least some example embodiments provide a pattern generator including a holder adapted to hold at least one workpiece. At least one writing head may include a plurality of exposure beams having a wavelength for exposing a layer of electromagnetic radiation sensitive material covering at least a portion of a surface of the at least one workpiece. At least one of the holder and the at least one writing head may be adapted to move rotationally such that the holder and the at least one writing head move relative to one another. At least one of the holder and the at least one writing head may be adapted to move relative to one another such that the holder and the at least one writing head move translationally relative to each other such that a trajectory of exposed area of the at least one workpiece may be formed.

In at least some examples embodiments, each optical writing unit may write a single pixel, an array of non-interfering pixels, or a combination thereof.

In at least some examples embodiments, one or more optical writing units may include an SLM with at least between about 1000 to about 1,000,000 elements, inclusive.

According to at least some example embodiments, the workpiece may be fixed, and the placement of a first pattern on the workpiece may be measured. The written pattern may be adjusted to match a distortion of the first pattern. The distortion of a first pattern on the workpiece may be measured and the distortion of said first pattern may be used to create a matching contiguous bitmap. The pattern written on the workpiece may include display devices of at least two different sizes. A pattern written on the workpiece may have one display with larger area than a quarter of the glass size.

In at least some examples embodiments, the rotating of the at least one writing head may create a helical pattern or helical shaped trajectories on the workpiece.

In at least some examples embodiments, the workpiece may be wrapped at least partly around the writing head.

At least one example embodiment provides a method for generating a pattern on a workpiece. The method may include scanning at least one optical writing unit across a surface of a workpiece creating a pixel grid, the pixel grid being arranged at an angle relative to axes of features of the pattern, the angle being different from 0, 45 or 90 degrees.

In at least some example embodiments, the scanning may create at least two equidistant scan lines. The scanning is performed in at least two directions.

At least one other example embodiment provides a writing apparatus for generating a pattern on a workpiece. The apparatus may include a writing head including at least one optical writing unit configured to scan across a surface of a workpiece to create a pixel grid, the pixel grid being arranged at an angle relative to axes of features of the pattern, the angle being different from 0, 45 or 90 degrees. The writing head may be configured to create at least two equidistant scan lines during scanning and/or may scan the workpiece in at least two directions.

At least one other example embodiment provides a method for generating a pattern on a workpiece. The method may include rotating a rotor scanner having a plurality of optical writing units, each of the optical writing units emitting electromagnetic radiation, and scanning, concurrently with the rotating of the rotor scanner, the workpiece by moving at least one of the workpiece and the at least one writing head in a direction perpendicular to a plane of rotation of the rotor scanner.

In at least some example embodiments, the electromagnetic radiation may be emitted in a radial direction relative to the rotor scanner. In at least some example embodiments, the electromagnetic radiation may be emitted in an axial direction relative to the rotor scanner. The scanning of the workpiece may include scanning the workpiece in a first direction to create a pixel grid, the pixel grid being created at an angle relative to at least one of the first direction and axes of the pixel grid, the angle being different from 0, 45 and 90 degrees. The workpiece may be scanned in a first direction to create a helical pattern on the workpiece. The electromagnetic radiation may be emitted in a direction parallel to at least one of a plane of rotation of the rotor scanner and the scanning direction of the rotor scanner.

At least one other example embodiment provides a writing apparatus for generating a pattern on a workpiece. The apparatus may include a rotor scanner including a plurality of optical writing units, each of the optical writing units emitting electromagnetic radiation. The rotor scanner may be configured to scan the workpiece by rotating the rotor scanner and moving at least one of the workpiece and the at least one writing head in a direction perpendicular to a plane of rotation of the rotor scanner.

At least one other example embodiment provides a method for patterning a workpiece. The method may include scanning a plurality of optical writing units across a surface of the workpiece, each of the plurality of optical writing units having a separate final lens, and moving the workpiece and the plurality of optical writing units relative to each other, the relative motion being a combination of linear movement and circular motion in a direction perpendicular to the linear motion.

At least one other example embodiment provides an apparatus for patterning a workpiece. The apparatus may include at least two optical writing units for patterning the workpiece, the at least two optical writing units including separate final lenses and a calibration sensor configured to detect characteristics of the at least two optical writing units. The calibration sensor may detect the characteristics of the optical writing units by scanning the at least two optical writing units across the calibration sensor.

In at least some example embodiments, the apparatus may further include at least one control unit for adjusting at least one parameter value associated with at least one optical writing unit based on the detected characteristics.

In at least some example embodiments, the at least one control unit may compare at least one detected characteristic to at least one set parameter value and adjusts at least one current parameter value based on the comparison. The at least one parameter may be a focus, position or power of an optical writing unit. The calibration sensor may include at least two detectors, each of the at least two detectors detecting one of the detected characteristics.

The at least two writing units may be single-point writing units, multi-point writing units or spatial light modulators. The apparatus may be a cylindrical pattern generator.

At least one other example embodiment provides an apparatus including a cylindrical holder for holding at least one workpiece, and a rotor scanner for patterning the at least one workpiece. The at least one rotor scanner may include at least two writing units and may be configured to move in an axial direction relative to the cylindrical holder and configured to rotate on an axis. The axis of rotation may be substantially perpendicular to the axial movement of the cylindrical holder.

In at least some example embodiments, the cylindrical holder may hold the at least one workpiece so as to at least partially enclose the rotor scanner, and the at least one rotor scanner may create a helical pattern on the at least one workpiece by emitting electromagnetic radiation in an outward radial direction.

In at least some example embodiments, the rotor scanner may be ring-shaped and configured to create a helical pattern on the at least one workpiece by emitting electromagnetic radiation in an inward radial direction. The cylindrical holder may further include air bearings for supporting the ring-shaped rotor scanner. In at least some example embodiments, the cylindrical holder may be stationary. The at least two writing units may be arranged in at least one row on an outer portion or an inner portion of the cylinder. Each of the at least two optical writing units may emit electromagnetic radiation in a different radial direction.

At least one other example embodiment provides a writing apparatus for patterning a workpiece. The writing apparatus may include a writing head including a plurality of writing units, each writing unit configured to emit electromagnetic radiation for patterning the workpiece, a detector for detecting characteristics of a writing unit and a control unit for adjusting the writing head to compensate for errors determined based on the detected characteristics.

In at least some example embodiments, the control unit may be further configured to determine at least one correlation associated with at least one of the optical writing units based on the detected characteristics and adjust the writing head based on the at least one correlation. The control unit may determine the correlation based on a comparison of the at least one characteristic and a corresponding set parameter value.

Another example embodiment provides a method for calibrating an optical writing head. The method may include detecting at least one characteristic of an optical writing unit included in the writing head, determining a correlation between the at least one detected characteristic and a corresponding set parameter value, and adjusting the writing head based on the determined correlation. The correlation may be generated by comparing the at least one detected characteristic with the corresponding set parameter value. The correlation may be a difference between the at least one detected characteristic and a corresponding set parameter value. The detected characteristic may be one of a focus of electromagnetic radiation emitted from the optical writing unit, power of electromagnetic radiation emitted from the optical writing unit and position of the optical writing unit.

BRIEF DESCRIPTION OF THE DRAWINGS

Example embodiments will be more clearly understood from the following detailed description taken in conjunction with the accompanying drawings in which:

FIG. 1A illustrates a rotor scanner with a single ring of single-point writing units, according to an example embodiment;

FIG. 1B illustrates a simplified view of the single-ring, single-point scanner writing sequentially lines from edge to edge of the workpiece and the adjustments needed for each writing unit, according to an example embodiment;

FIG. 1C shows an example embodiment of the rotor scanner using spatial light modulators (SLMs) building the image from SLM fields ("stamps") and the adjustments needed for each writing unit, according to an example embodiment;

FIGS. 1D-1F illustrate conventional pattern generators;

FIGS. 12A-12E illustrate an SLM arrangement and workpiece arrangement relative to the rotational direction of the rotor scanner;

FIG. 13 illustrates an auto focus arrangement, according to an example embodiment;

FIG. 14 is a top-view of a calibration sensor, according to an example embodiment;

DETAILED DESCRIPTION OF EXAMPLE EMBODIMENTS

Figure 2:
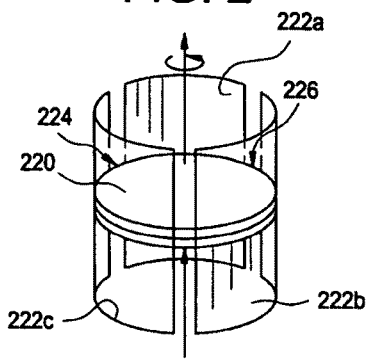
FIG. 2 illustrates a writing apparatus, according to another example embodiment.

Example embodiments are described with reference to the figures. These example embodiments are described to illustrate the present invention, not to limit its scope, which is defined by the claims. Those of ordinary skill in the art will recognize a variety of equivalent variations on example embodiments described as follows.

In at least some examples embodiments, a rotor scanner may be in the form of a ring. In this example, each of a plurality of optical writing units may be arranged and configured to emit electromagnetic radiation in the form of at least one laser beam. The laser beams may be emitted in at least two directions. In at least some examples embodiments, the laser beams may be emitted in at least two parallel directions. In at least some examples embodiments, the laser beams may be emitted in a radial direction inward toward a workpiece arranged on a cylindrical holder positioned inside the ring-shaped rotor scanner.

In at least some examples embodiments, the rotor scanner may be in the form of a disc. In this example, each of the plurality of optical writing units may be arranged and configured to emit electromagnetic radiation in the form of at least one laser beam in a radial direction outward toward at least one workpiece arranged so as to at least partly enclose the disc-shaped rotor scanner. Alternatively, the disc-shaped rotor scanner may be ring-shaped.

For the sake of clarity, a rotor scanner including optical writing units arranged and configured to emit electromagnetic radiation in the form of at least one laser beam in an outward radial direction will be referred to hereinafter as a disc rotor scanner, whereas the rotor scanner including optical writing units arranged and configured to emit electromagnetic radiation in the form of at least one laser beam in an inward radial direction will be referred to herein as the ring rotor scanner. A rotor scanner configured to emit electromagnetic radiation in the form of at least one laser beam in an axial direction will be referred to herein as an axial rotor scanner. Hereinafter, when discussing aspects of example embodiments applicable to both the disc rotor scanner and the ring rotor scanner, the disc rotor scanner and the ring rotor scanner will be referred to collectively as a rotor scanner.

The workpiece may be flexible (e.g., very flexible) and may need a cylindrical support to have and maintain a desired radius. The inner part of the workpiece may more easily assume a cylindrical shape; however, at edges parallel to the cylinder axis, a bending moment may be introduced to start bending the workpiece at the proper bending radius. This bending moment may be on the order of a few kg*cm, and may be introduced by a lengthwise clamp. This clamp may also support the workpiece as workpiece is loaded into the machine.

The workpiece may have a thickness tolerance of about +/−70 µm and a variation of less than about 20 µm over a length of about 150 mm. This variation may disturb the focus position and may be corrected in focus and/or in the shape of the workpiece. For example, the shape from the rotor scanner may be measured, and the shape of the workpiece may be corrected. The active workpiece shape may be corrected only within the writing zone. In this example, the corrector hardware may follow along with the rotor scanner assembly, which may reduce the number of actuators. The use of a corrector may use optics with a shorter depth of field.

The rotor scanner may be supported by bearing pads (e.g., air bearing pads) that may control the position of the axis of rotation and/or the lengthwise position of the rotor scanner. The positioning in the direction of rotation may be adjusted by timing of the pattern. The dynamic positioning in the axis lengthwise direction may, depending on the design, need active components to move the image plane.

The rotor scanner position may be determined by several different methods, according to example embodiments. For example, in the ring rotor scanner marks on the periphery may be detected, for example, optically, and the position of the rotor scanner may be interpolated between these marks or positions. The air friction may be reduced (e.g., to about 0.1 N), and the speed may be increased. The time between markers may be shorter and/or the possible deviations due to residual forces may decrease as this "time between markers" squared. In example embodiments having a vertical axis, internal accelerometers in the rotor scanner may be mused to achieve a more accurate feedback signal. The feedback signal may be used for velocity control. In example embodiments having a horizontal axis, accelerometers may also be used; however, in this case the accelerometers may need to be balanced such that the direction of the forces of gravity is unseen. Although not described herein, interferometry or any other suitable methods may also be used.

Velocity differences of the scanner rotor may be measured with, for example, internal rotation accelerometers and the rotational accuracy may be improved. Angular position of the rotor scanner may be measured using a plurality of markers (e.g., optical markers) around an outer edge of the rotor scanner. A control system may use the markers as an absolute measurement of position of the rotor, and may interpolate the "in between position" by time. The accuracy of the interpolation may be increased by using internal rotational accelerometers.

The rotor may be balanced using distance sensors, a pressure signal from a bearing pad, or any other suitable measuring device. In example embodiments, the rotor scanner may be supported by bearings, air bearings, air bearing pads, etc.

In at least some examples, transfer of data may be eased by rendering the patterns such that they are streamed to the rotor with little adjustment. In this example, the data may be rendered in a predistorted manner, and stored so that each arc is represented by a column of data in the memory. As the workpiece is written, columns may be read (e.g., successively) from left to right in a memory matrix and the data may be sent through to the rotor scanner.

FIG. 1A shows a rotor scanner with a single ring of single-point optical writing units, according to an example embodiment. FIG. 1B shows a simplified view of the single-ring, single-point scanner writing sequentially lines from edge to edge of the workpiece, and the adjustments needed for each writing unit. FIG. 1C shows an example embodiment of a rotor scanner using SLMs to generate the image from SLM fields ("stamps") and the adjustments needed for each writing unit.

Referring to FIG. 1A, the pattern generation apparatus may include a rotor scanner 1. The rotor scanner 1 may be disc shaped and may include at least one (e.g., a plurality of) writing head 10. Each of the write heads 10 may emit light in a radial direction. A workpiece 20 may partly enclose the rotor scanner 1. The rotor scanner 1 may be rotatable and may rotate at a constant or substantially constant speed. A power slip ring may be placed at the center. The slip ring may be a graphite/copper slip ring, an HF transformer contactless slip ring, a frictionless slip ring, or any other suitable slip ring. In example embodiments, an HF slip ring may reduce (e.g., eliminate) dust common with ordinary slip rings.

Still referring to FIG. 1A, a workpiece may be bent such that the curvature of the workpiece has a radius larger (e.g., slightly larger) than that of the disc rotor scanner and/or such that the focal spot of the optical system may be matched. Alternatively, in example embodiments of the ring rotor scanner, a workpiece may be bent such that the curvature of the workpiece has a radius less than that of the ring rotor scanner and/or such that the focal spot of the optical system may be matched. In example embodiments in which the workpiece is bent or curved, the workpiece may be, for example, a workpiece capable of bending to a desired curvature, such as, a glass workpiece, a plastic workpiece, etc.

In an example embodiment in which a workpiece is bent (e.g., wrapped) to a curvature spanning about 180°, the disc rotor scanner may have a diameter of, for example, about 1.4 meters (m). A smaller bend radius (e.g., a minimum bend radius) of about 1.3 m may be used when the workpiece is wrapped about 180 degrees around a disc write head. The cylindrical support for a glass wrapped approximately 180 degrees may have a radius of between about 1 and about 2 meters, inclusive.

In a system for writing one workpiece at a time the workpiece may be bent to about or near 360°. A workpiece (e.g. glass, plastic, metal, ceramic, etc.) may be between about 2 and about 3 meters, inclusive, or up to about 6 meters and the corresponding cylinder for a single glass may have a radius of about 0.35 to about 0.6 meters, inclusive, and up to about 1 meter. Bending a glass workpiece with a radius of about 1.3 meters may produce a stress of around 31 MPa per mm workpiece thickness. With workpiece thickness of about 0.7 mm the stress may be about 22 MPa, and only a smaller fraction of the safe stress.

In another example, if the workpiece is wrapped to a curvature spanning about 120°, the disc rotor scanner may have a diameter of about 2.1 m. In this case it may be suitable to employ a cylindrical support with a radius of about 2 to about 3 m, inclusive. In these examples, the overall width of the pattern generator may be smaller than that of conventional pattern generators and/or writing apparatuses, for example, about 2 m wide. The workpiece may be sectional (e.g., cut into sheets) or in a continuous form, for example, for roll-to-roll processing of displays and/or solar panels.

Referring back to FIG. 1A, the rotor scanner may rotate in a counter-clockwise direction; however, alternatively the rotor scanner may rotate in a clockwise direction. As shown in FIG. 1A, while rotating, the rotor scanner 1 may be moved in an upward vertical scan direction 50; however, it will be understood that the rotor scanner may move in a downward direction or a horizontal direction (e.g., to the right or to the left). A pattern to be printed on the workpiece 20 may be determined by a modulation of the writing heads 10. During operation (e.g., patterning or writing), electromagnetic radiation from the writing heads 10 may form a helical pattern 30 on the workpiece 20.

The lengthwise scan of the workpiece 20 may be accomplished by moving the workpiece 20 and/or the rotor scanner 1. Because the rotor scanner 1 may be thinner or substantially thinner than the workpiece 20 and/or workpiece holder (not shown), the rotor scanner 1 may be moved and the workpiece 20 may be written without a need for additional length. The non-rotating part of the rotor scanner 1, or bearing pads may perform the axial scan and/or carry other (e.g., all other) functions.

A rotor scanner 1 may be supported by bearing pads (e.g., air bearing pads). In this example, the ring design may have additional room for the bearing pads on the inner ring radius.

The rotor scanner 1 may be balanced (e.g., very accurately balanced). Any residual unbalance may be more easily detected, for example, by back-pressure variations in the bearing pressure pads (e.g., air bearing pressure pads) or by other position sensors. An automatic balancing system that may continuously balance the rotor scanner may also be used. Disturbances to the rotor scanner 1 may be a result of airflow between the rotor scanner and/or a rotor scanner shield. If the air flow between the rotor scanner and the rotor scanner shield is forced to be laminar, for example, by choosing a suitably small gap (e.g., a few mm at 5 m/s), stability of the operating conditions may be increased. The laminar flow may introduce forces, for example, stationary forces. In example embodiments, the power loss to friction may be reduced (e.g., to a few watts), and the rotor scanner may be driven by any suitable motor. For example, the friction at a 1 mm gap at 5 m/s may have a loss of 0.5 W per $m^2$. The bearing pads may have a smaller gap and/or larger drag, which may be offset by the smaller area. The motor may have a drive system having uniform, or substantially uniform, torque while turning.

The number of optical writing units included in the disc rotor scanner 1 may be based on write speed. In at least one example embodiment, the writing units may be fed data from a data channel with a higher (e.g., a very high) data rate, (e.g., about 200, 400, 500 or more Gbit/sec). Because the machine may be used for production, the pattern may be the same or substantially the same at all times. If the pattern is stored locally inside the rotor scanner, the pattern may be loaded at a lower speed (e.g., through a conventional high speed link) while the rotor scanner is stationary. The pattern may then reside (e.g., permanently reside) in memory. This may avoid the rotating data joint.

As shown in FIGS. 1A and 1B, the optical writing units may be, for example, single point laser diodes. The laser diodes may be of any commercial available wavelength such as blue, red, violet, etc. The power of a laser diode may be, for example, about 5 mW to about 65 mW, inclusive for single mode, and about 5 mW to about 300 mW, inclusive for multimode diodes. An electro-optical efficiency of a laser diode may be, for example, about 13%. The laser diodes may act as an optical power source and a modulator, for example, simultaneously. Alternatively, as shown in FIG. 1C, the optical writing units may be SLMs.

The axis of rotation of the rotor scanner may be vertical, horizontal, or any angle there between. The vertical axis arrangement may have a constant, or substantially constant, acceleration of the optical writing units at all times. The horizontal axis arrangement may handle the workpiece more efficiently and/or with less effort absent the need to counter-act forces of gravity.

Figure 7A:
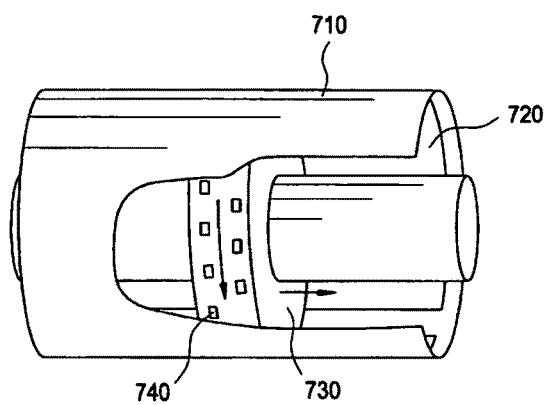
FIGS. 7A-7C illustrate different implementations and orientations of a disc-type writing apparatus, according to example embodiments.
Figure 7B:
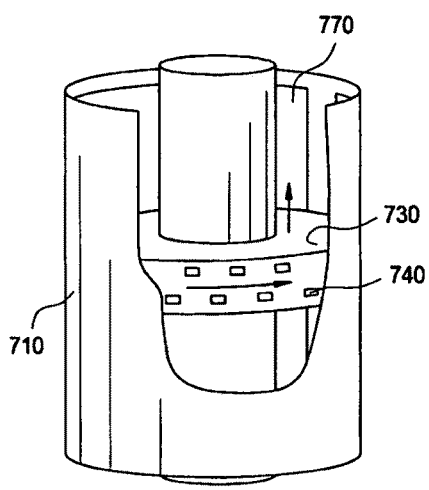
Figure 7C:
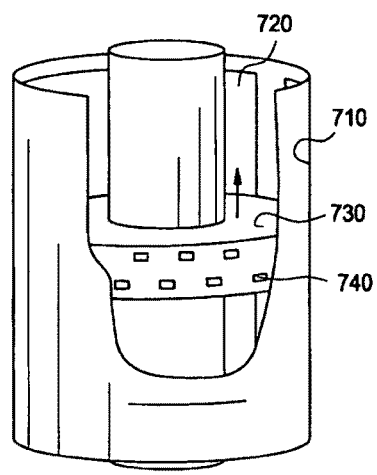

FIGS. 7A-7C illustrate different implementations and orientations of a writing apparatus, according to example embodiments. The disc rotor scanner discussed below with regard to FIGS. 7A-7C may be the same or substantially the same as the disc rotor scanner 1 of FIG. 1. Therefore, a detailed discussion will be omitted for the sake of brevity.

Referring to FIG. 7A, the writing apparatus 700 may include a holder (e.g., a tubular holder) 710, a disc rotor scanner 730 and/or at least one optical writing unit 740. In at least some examples embodiments, the disc rotor scanner 730 may include a plurality of optical writing units 740.

The workpiece 720 may be arranged inside the workpiece holder 710. A central axis of the formed holder 710 may be arranged, for example, horizontally. The holder 710 may be kept at a fixed position, while the disc rotor scanner 730 rotates and/or moves in a direction parallel or substantially parallel to the central axis. The optical writing units 740 may be arranged on an outer edge of the disc rotor scanner in at least one row, but are shown as including two rows in FIG. 7A. The optical writing units 740 may face an inner surface of the workpiece holder 710. Alternatively a single row or greater than two rows of optical writing units 740 may be used.

Referring to FIG. 7B, the central axis of the workpiece holder 710 may be arranged vertically. The workpiece 720 may be arranged inside the holder 710 as discussed above with regard to FIG. 7A. The workpiece 720 may be fixed in the holder 710 by forces, which may flatten, or substantially flatten the workpiece 720. Alternatively, the workpiece 720 may be fixed to the holder 710 by vacuum nozzles. In this example, the workpiece 720 may be fixed in the holder 710 by removing the air between the workpiece 720 and the holder 710. The workpiece 720 and holder 710 may be fixed while the disc rotor scanner 730 may rotate and/or move vertically (e.g., upward and/or downward).

Referring to FIG. 7C, the writing apparatus of FIG. 7C may be similar or substantially similar to the writing apparatus discussed above with regard to FIG. 7B. However, in the writing apparatus of FIG. 7C, the workpiece 720 and/or the holder 710 may rotate while the disc rotor scanner 730 moves in a vertical direction (e.g., upwards and/or downwards).

FIG. 2 illustrates a writing apparatus, according to yet another example embodiment. As shown, the writing apparatus of FIG. 2 may be used to pattern a plurality of workpieces concurrently or simultaneously. Although the writing apparatus of FIG. 2 will be discussed with respect to patterning three workpieces 222A, 222B and 222C, simultaneously, it will be understood that any number of workpieces may be patterned concurrently. The rotor scanner 220 of FIG. 2 may be the same or substantially the same as the rotor scanner 1 of FIG. 1.

Referring to FIG. 2, the workpieces 222A, 222B and 222C, may at least partially enclose or surround the rotor scanner 220. As shown, openings 224, 226, and 228 may be left between each of the workpieces 222A, 222B and 222C. At least one of a detector and a calibration sensor (not shown, but described in more detail below) may be positioned in each space between the workpieces. In at least one example embodiment, the detector and/or calibration sensor may monitor the position, focus and/or power of the rotor scanner 220. Any misalignment of the rotor scanner 220 relative to a desired position may be compensated, for example, using dose, modulation delaying, timing, image distortion, or any other suitable manner.

Figure 3:
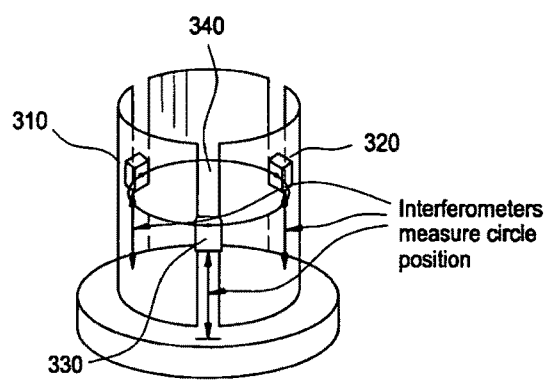
FIG. 3 illustrates an arrangement of calibration sensors between workpieces, according to an example embodiment.

FIG. 3 illustrates a plurality of calibration sensors 310, 320 and 330 positioned in the openings 224, 226 and 228, respectively. As shown in FIG. 3, three workpieces are held by the writing apparatuses and three calibration sensors are used. In accordance with example embodiments, the number of calibration sensors may be correlated to the number of workpieces concurrently arranged in the writing apparatus. In some example embodiments, the number of calibration sensors may be equal to the number of workpieces.

Figure 4:
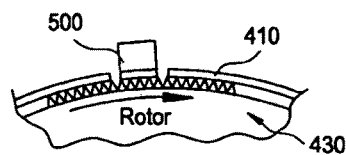
FIG. 4 is a side-view of a calibration sensor, according to an example embodiment.

FIG. 4 is a top view of a portion of the writing apparatus of FIG. 2 including a calibration sensor (e.g., a calibration eye), according to an example embodiment. FIG. 14 is a side view corresponding to the top view of FIG. 4.

Referring to FIGS. 4 and 14, the calibration sensor 400 may detect position, power and/or may focus individual beams 410 of a rotor scanner 430 based on characteristics of the electromagnetic radiation emitted from the optical writing units (not shown) of the rotor scanner 430. In at least some example embodiments, the calibration sensor 400 may include an interferometer (not shown) for measuring the position (e.g., the vertical position of the rotor scanner if the pattern generation apparatus is oriented vertically) of the rotor scanner 430. Interferometers are well-known in the art, and therefore, a detailed discussion will be omitted for the sake of brevity. The rotor scanner 430 may be the same or substantially the same as the rotor scanners 1 and/or 220, and thus, a detailed discussion will be omitted for the sake of brevity.

If a single workpiece 420 is wrapped on the holder, the calibration sensor 410 may be arranged between the edges of the workpiece 420. In example embodiments, the workpiece 420 may be wrapped onto a holder (e.g., a tubular shaped holder). The rotor scanner 430 may rotate inside the wrapped workpiece 420. In at least example embodiments, a distance between a scanner base 440 and the rotor scanner 430 may be measured using, for example, laser interferometry or any other suitable technique.

Figure 5:
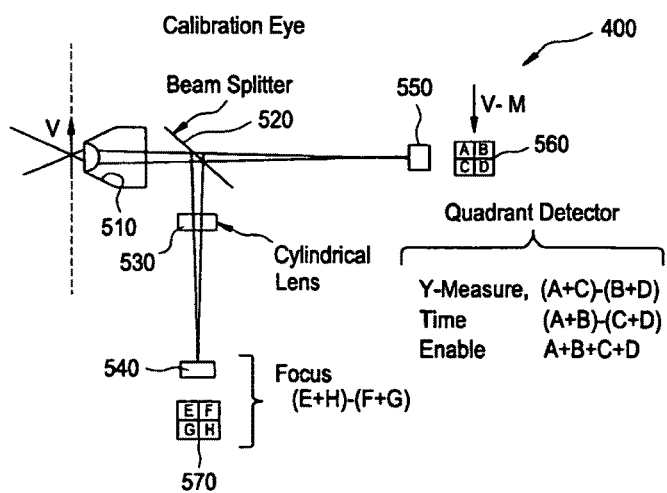
FIG. 5 is a schematic representation of a calibration sensor, according to an example embodiment.

FIG. 5 is a schematic representation of the calibration sensor 400, according to example embodiments. The calibration sensor 400 may include a lens assembly 510 through which electromagnetic radiation, emitted from the optical writing units of the rotor scanner may pass. The electromagnetic radiation may be partially reflected by a beam splitter 520. A first portion of the electromagnetic radiation may pass through the beam splitter 520 and irradiate a first quadrant detector 550. A second portion of the electromagnetic radiation may be reflected by the beam splitter 520, be focused by a cylindrical lens 530 and impinge a focus detector 550. The quadrant detector 550 may further include a plurality of quadrant detectors A, B, C and D, collectively referenced by 560. The focus detector 540 may include plurality of quadrant detectors E, F, G and H, collectively referenced by 570.

In example embodiments, the quadrant detector 550 may determine a Y-measure using the equation (A+C)−(B+D), the timing of the rotor scanner using the equation (A+B)−(C+D) and the enable of the rotor scanner using the equation (A+B+C+D). The focus detector 540 may determine the focus of the beams emitted by the writing units using the equation (E+H)−(F+G). The focus detector 540 may be any suitable device for measuring de-focus using, for example, an astigmatic (on axis) optical system. The astigmatism is added using the cylindrical lens 540. The cylindrical lens 540 adds power along an axis perpendicular to the axis of rotation of the cylinder. The axis of the cylinder may be tilted such that that the cylinder passes through centers of, for example, detectors E and H.

Using the cylinder lens, an imaging system with two different powers may be realized. In one direction (D1), where the cylinder adds its power, and another direction (D2), where it does not.

When the focus position matches the power of D1, a line image passing through the center of detectors E and H (e.g., along the axis of the cylinder) is produced. Conversely, if the focus point position matches the power of D2, line image is produced along the center of detectors F and G. Thus, the difference (E+H)−(F+G) is proportional to a position of the focal point.

The calibration sensor of FIG. 5 may be used to calibrate focus, power and/or position of the optical writing units. For example, the focus detector 540 and the position detector 550 in FIG. 5 may be used to calibrate a focus and position detector in each optical writing unit. A focus and position detector and each optical writing unit will be described in more detail with regard to FIG. 6 below.

Figure 6:
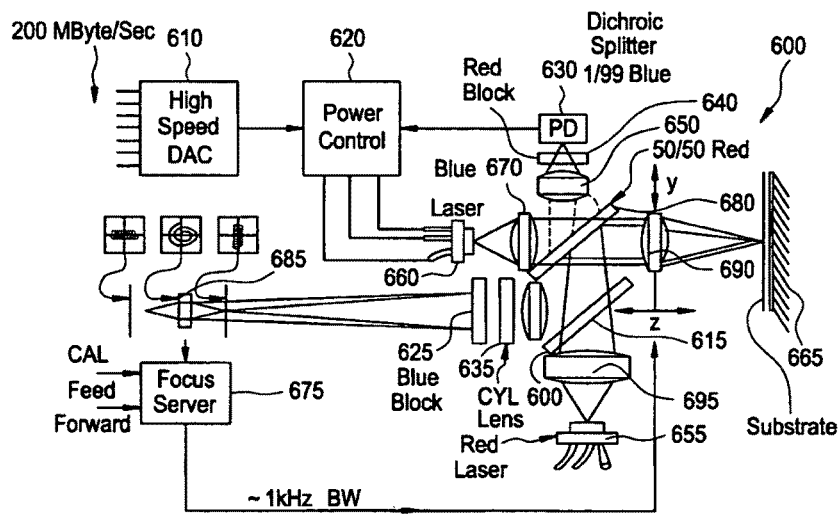
FIG. 6 illustrates a combination optical writing unit and optical measurement unit, according to an example embodiment.

FIG. 6 illustrates an optical writing unit (e.g., a writing laser diode), according to an example embodiment. The optical writing unit 600 of FIG. 6 may be used as the optical writing units 740 of FIGS. 7A-7C and/or the optical writing units 840 of FIGS. 8A-8C.

Referring to FIG. 6, the optical writing unit 600 may include a digital-to-analog converter (DAC, e.g., a high speed DAC) 610 for transforming pattern data into modulation signals for the blue laser diode 660. The pattern data may be received via a data channel (not shown). The data channel may be, for example, a fiber-optic cable, a radio-frequency (RF) link passing through the center of the HF transformer, or any other suitable data channel capable of providing higher data rates, such as, 200 Gbits/s, 400 Gbits/s, 500 Gbits/s, etc.

The modulation signals generated by the DAC 610 may be output to a power controller 620. The power controller 620 may control the power of a blue laser 660 based on the modulation signals from the DAC 610 and power control signals output by a power detector 630. The blue laser 660 may emit electromagnetic radiation (e.g., blue laser beam) for patterning the workpiece 665 based on power control signals output from the power controller 620. The blue laser output from the blue laser 660 may pass through a lens assembly 670, which may make the beam telecentric. After passing through the lens assembly 670, the telecentric blue laser may be incident on a beam splitter 680. The beam splitter 680 may direct a portion (e.g., a relatively small portion) toward the lens assembly 650. The remaining portion of the blue laser beam may pass through the beam splitter 680 and be focused on the workpiece by the focus lens assembly 690.

The redirected portion of the blue laser beam may be focused by the lens assembly 650, pass through red block 640 and be incident on the power detector 630. The power detector 630 may detect the power of the incident blue laser light, and output a power control signal indicative of the detected laser power. The red block 640 may block (e.g., reflect, absorb, etc.) all, or substantially all, red laser light incident thereon.

A red laser diode 655 may also emit electromagnetic radiation in the form of red laser beam. The red laser beam may be used for positioning, focus control and/or determining shape of the workpiece. In at least one example embodiment, the red laser beam may pass through a telecentric lens assembly 645 and be incident on a beam splitter 615. The telecentric lens assembly 645 may be the same or substantially the same as the telecentric lens assembly 670 discussed above. Thus, for the sake of brevity, a detailed discussion will be omitted. A beam splitter 615 may transmit the red laser beam to the beam splitter 680, which may direct the red laser beam onto the workpiece 665. The red laser beam may be reflected by the workpiece 665 back toward the beam splitter 680, which may relay the red laser beam toward the beam splitter 615. The beam splitter 615 may direct the red laser light toward the focus and position detector 685 via cylindrical lens 635 and/or blue laser block 625. The blue laser block 625 may block (e.g., reflect, absorb, etc.) all, or substantially all, blue laser light incident thereon.

The focus and position detector 685 may output positioning signals to a focus Z servo 675. The focus Z servo 675 may receive the positioning signals from the position detector 685 and calibration data, and control the position of the lens assembly 690 via a data connection (e.g., a 1 kHz bandwidth data line). For example, the focus Z servo 675 may move the lens assembly 690 in an X-direction, Y-direction and/or Z-direction depending on the shape of the signal from the focus and position detector 685. The control loop signals may be supplemented by feed forward signals from a control system (e.g., a computer or processor, not shown) to correct for known distortions such as focus errors.

According to at least some example embodiments, a position and/or form of the workpiece may be determined using laser diodes having a wavelength not affecting the electromagnetic radiation sensitive layer on top of the workpiece. In at least some examples, blue laser diodes may affect the electromagnetic radiation sensitive layer and red laser diodes may be used for measurement of the position and form of the workpiece. Laser diodes exposing the workpiece and laser diodes used for measurement and not affecting the electromagnetic radiation sensitive layer may be arranged in the writing head (rotor).

FIG. 13 is a more detailed illustration of an auto focus arrangement of an optical writing unit for focusing and position (or displacement) determination, according to an example embodiment. Emitted electromagnetic radiation (e.g., a laser beam) from a laser diode 1310 enters a lens assembly 1330, which telecentrizes the beam. The telecentric beam may impinge on a beam splitter 1340, which directs the beam toward a lens assembly 1350. The lens assembly 1350 may focus the beam onto the workpiece 1370. A cover glass 1360 may be arranged between the lens assembly 1350 and the workpiece 1370 to protect the lens assembly 1350. When the beam impinges on the workpiece 1370, the beam may be reflected back through the lens assembly 1350 to the beam splitter 1340. The beam splitter 1340 may direct the reflected beam onto the detector 1320 for detecting the focus of the laser beam. The detector 1320 may detect the focus of the laser beam in any suitable well-known manner. Because methods for detecting focus of a laser are well-known in the art, a detailed discussion will be omitted for the sake of brevity. The lens assembly 1350 may be moved in any direction based on the read out of the detector 1320.

Referring back to FIG. 6, each optical writing unit 600 may have a set value for each of the power, position and focus parameters. When the optical writing unit 600 passes the calibration sensor of FIG. 5, the optical writing unit 600 obtains data as to how each set parameter value correlates to a parameter value (e.g., power, position and/or focus value) measured by the calibration sensor. The error or difference between the set values stored in the optical writing units 600 and the measured values is sent to the writing head for adjustment, for example, to offset the writing head's internal scale. This adjustment may be done, for example, each time each optical writing unit passes a calibration sensor. However, the adjustment may be performed less often.

According to example embodiments, the calibration of power, focus and/or position (x,y, where x is done by time delay) may be in different calibration sensors, so long as the calibration source of each focus, power and position is common. That is, for example, power, focus and/or position may be calibrated using a different calibration sensor so long as each writing head uses the same calibration sensor for focus, the same calibration sensor for power, and the same calibration sensor for x position and the same calibration sensor for y-position. Power may be measured in a wavelength dependent manner to compensate for variation of wavelength sensitivity of the resist.

Figure 30:
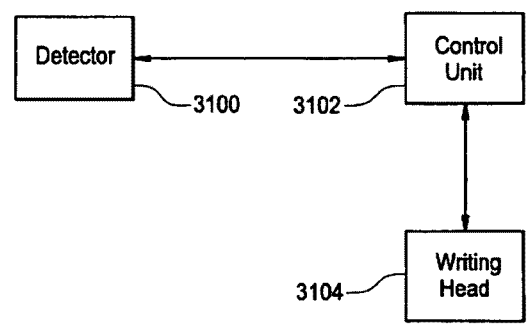
FIG. 30 illustrates a calibration system, according to another example embodiment.

FIG. 30 illustrates a calibration system, according to another example embodiment. As shown, the calibration system may include a detector 3100, a control unit 3102 and a writing head 3104. The detector 3100 may be, for example, a calibration sensor (e.g., as discussed above with regard to FIG. 5) or any other optical detector capable of detecting, for example, focus, power and/or position of one or more optical writing units. The control unit 3102 may be implemented, for example, in the form of software executable on a computer or processor. The writing head 3104 may be a writing head including a plurality of optical writing units, one or more of which may be an optical writing unit as described above with regard to FIG. 6. However, the writing head may be any writing head capable of exposing a workpiece and/or generating a pattern on a workpiece. Each of the detector 3100, the control unit 3102 and/or the writing head 3104 may be connected via a data channel. The data channel may be, for example, a fiber-optic cable, a radio-frequency (RF) link passing through the center of the HF transformer, or any other suitable data channel. An example operation of the calibration system of FIG. 30 will be described with regard to FIG. 31.

Figure 31:
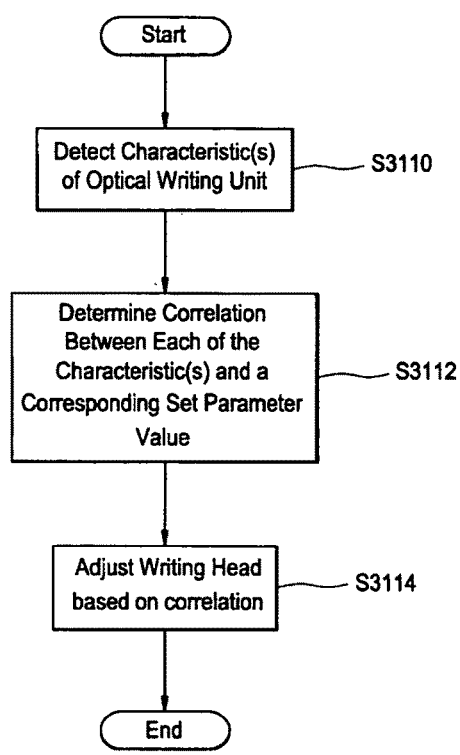
FIG. 31 illustrates a calibration method, according to an example embodiment.

FIG. 31 illustrates a calibration method, according to an example embodiment. As discussed above, the method of FIG. 31 may be performed, for example, by the calibration system of FIG. 30. The method of FIG. 31 may also be performed by one or more calibration sensors (e.g., 400 of FIG. 4) in connection with one or more writing heads (e.g., 430 of FIG. 4). In these examples, the control unit 3102 may correspond to, for example, the power control unit 620 and the focus Z servo 675 of FIG. 6, and the detector 3100 may correspond to the quadrant detector 550 of FIG. 5, the focus detector 540 of FIG. 5 and the power detector 630 of FIG. 6. In the example embodiment shown in FIG. 30, the quadrant detector 550 of FIG. 5, the focus detector 540 of FIG. 5 and the power detector 630 of FIG. 6 may be located at the detector 3100, and the power control unit 620 and the focus Z servo 675 may be located at the control unit 3102. Alternatively, however, other configurations are possible.

Referring to FIG. 31, at S3110, when an optical writing unit of the writing head 3104 passes the detector 3100 may detect at least one characteristic of the optical writing unit. For example, the detector 3100 may detect characteristics, such as, focus, position and/or power of electromagnetic radiation (e.g., the laser beam) emitted from the optical writing unit. The detector 3100 may send the at least one detected characteristic to the control unit 3102.

At S3112, the control unit 3102 determines a correlation between the detected characteristics and a corresponding set parameter value. For example, a detected focus characteristic may be compared with a set focus parameter value, a detected power characteristic may be compared with a set power value and/or a detected position characteristic may be compared with a set position value. The set parameter values may be set, for example, by a human operator, based on empirical data. In at least one example embodiment, the correlation associated with each detected characteristic and corresponding set parameter value may be an error or difference between the set value and the measured characteristic value. The set parameter values may be stored in a memory at the control unit 3102. The memory may be any suitable storage medium, such as, a flash memory or the like.

At S3114, the control unit 3104 may adjust the writing head based on the determined correlation. For example, the determined correlations may be used to offset the internal scale of the writing head 3104.

Although only a single iteration of this method is shown in FIG. 31, the operation described therein may be done, for example, each time each optical writing unit passes a calibration sensor. However, the adjustment may be performed less often.

Figure 8A:
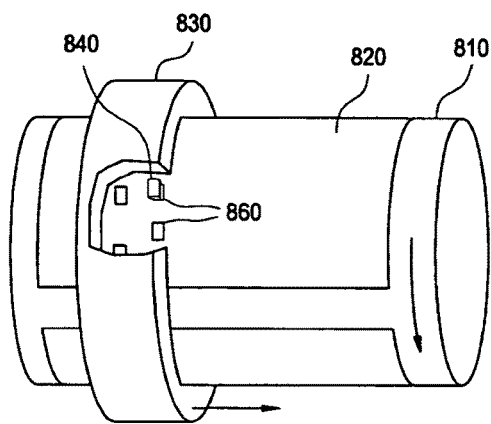
FIGS. 8A-8C illustrate different implementations and orientations of a ring-type writing apparatus, according to another example embodiment.
Figure 8B:
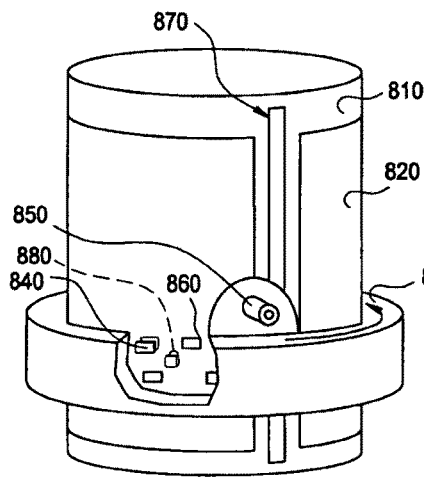
Figure 8C:
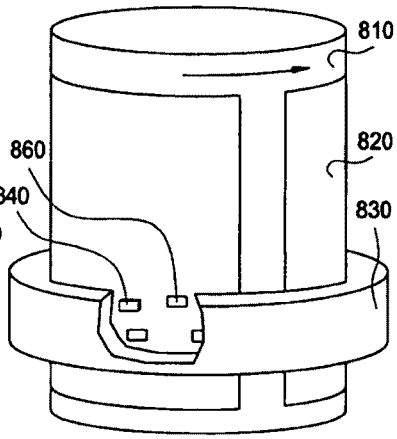

FIGS. 8A-8C illustrate different implementations and orientations of a ring-type writing apparatus, according to another example embodiment.

Referring to FIG. 8A, the writing apparatus may include a holder (e.g., a cylindrical stage or tube formed holder) 810, a rotor scanner 830 and/or at least one optical writing units 840. A workpiece 820 may be arranged on the outside of the holder 810. The workpiece 820 may be fixed onto the holder 810 using, for example, vacuum nozzles 850. The rotor scanner 830 may rotate outside the workpiece holder 810 and optical writing units 840 may emit radiation in a radial direction inward toward the central axis of the holder 810. In example embodiments, the optical writing units may be, for example, 840 may be, for example, single point laser diodes, multi-point laser diodes or spatial light modulators (SLMs). The laser diodes may be of any commercial available wavelength such as blue, red, violet, etc. The power of a laser diode may be, for example, about 5 mW to about 65 mW, inclusive, for single mode, and about 5 mW to about 300 mW for multi-mode diodes. An electro-optical efficiency of a laser diode may be, for example, 13%. The laser diodes may act as an optical power source and a modulator, for example, simultaneously. The spatial light modulators (SLMs) 840 may be at least partially transmissive spatial light modulators, and may create stamps or patterns 860 on the workpiece 820. SLMs are well-known in the art, and thus, a detailed discussion will be omitted for the sake of brevity. As shown in FIG. 8A, the central axis of the workpiece holder 810 may be oriented horizontally.

Still referring to FIG. 8A, in operation, the ring rotor scanner 830 may rotate around the central axis of the holder 810 and move in an axial direction relative to the holder 810 and parallel to the central axis of the holder 810. In addition, the holder 810 may rotate around its central axis in a rotational direction opposite to that of the ring rotor scanner 830.

FIG. 8B shows an example embodiment including a stationary cylindrical holder 810 holding a wrapped workpiece 820, and a rotating writing head 830. Referring to FIG. 8B, the workpiece holder includes a slit 870 in which a calibration sensor 850 is arranged. The calibration sensor 850 may be movable or fixed. The writing head 830 includes a plurality of optical writing units 840 creating patterns 860 on the workpiece 820. An alignment camera 880 may capture an existing pattern on the workpiece 820 such that a written pattern may be aligned with higher accuracy, thereby increasing overlay precision.

FIG. 8C shows an example embodiment including a rotating cylindrical holder 810 holding a wrapped workpiece 820, and a stationary writing head 830. The writing head 830 may include a plurality of optical writing units 840 creating patterns 860 on the workpiece 820. The optical writing units 840 of FIG. 8C may be the same or substantially the same as the optical writing units 840 of FIG. 8A. As is the case with respect to FIG. 8B, the writing head 830 may include multiple writing units 840, although, for the sake of clarity, only one writing unit 840 is illustrated.

Figure 9:
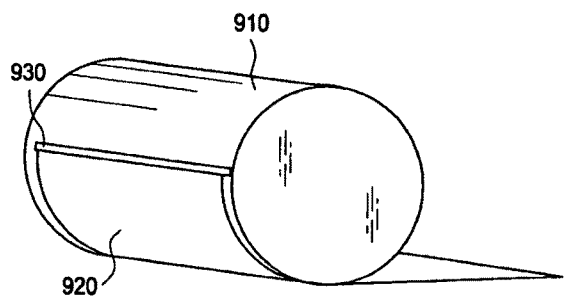
FIG. 9 illustrates a horizontal oriented cylindrical stage or holder, according to an example embodiment.

FIG. 9 shows a horizontal orientation of a cylindrical stage or holder 910, according to an example embodiment. When loaded horizontally, a workpiece 920 may be kept in place by gravitational force. The workpiece 920 may be held in place by a vacuum to ensure that the surface follows the surface of the cylinder 910 closely. The ends of the workpiece 920 may be fastened securely to the cylinder by a latch 930. The latch 930 may be controlled to capture or release the edge of the workpiece 920.

The workpiece may be pushed or pulled onto or into the cylindrical support surface to assume the proper shape. In another example, a vacuum clamp or any other suitable clamp may also be used. The edges along the cylindrical part may bend locally away from the center or curvature (e.g., similar to bending an eraser). This bending may be restrained by a fixture system (e.g., a vacuum fixture system).

Figure 21:
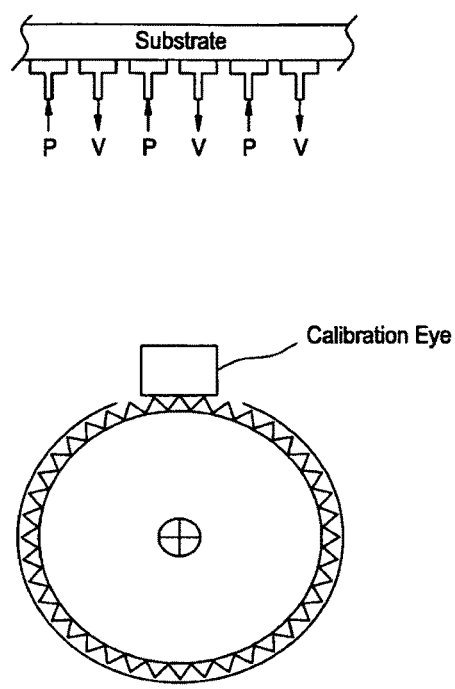
FIG. 21 shows a vacuum arrangement for holding the workpiece on the cylinder.

FIG. 21 shows a vacuum arrangement for holding the workpiece on the cylinder. As shown, vacuum and pressure devices may be alternately arranged. A push-pull vacuum clamping system may be used to counteract workpiece deformation in the x-y plane. As shown in FIG. 21, the system may have pressure and vacuum holes spaced closer together (e.g., on a millimeter scale). The vacuum holes may hold the workpiece and reduce the deformation, and the pressure pads may keep the workpiece away from the supporting surface. The workpiece may not touch the support surface, and may be supported at a few μm (e.g., 1, 2, 10, 20, etc. μm) away from the support surface. This may allow the workpiece to more freely assume natural shape in the plane of the workpiece. The vacuum arrangement of FIG. 21 or an arrangement similar or substantially similar thereto may be used in conjunction with each example embodiment described herein.

Figure 10:
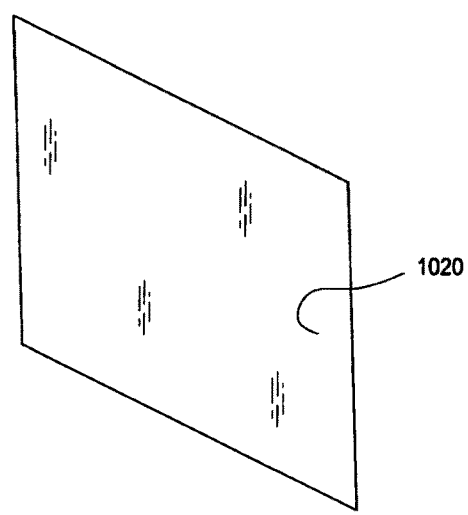
FIG. 10 illustrates a flat workpiece, which may be written using a writing apparatus, according to one or more example embodiments.
Figure 11:
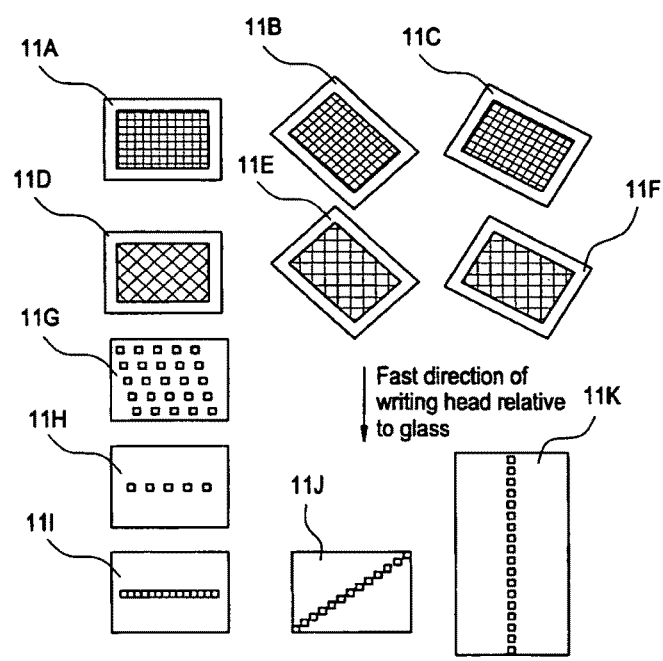
FIGS. 11A-11K illustrate a plurality of different positions of a writing head in relation to the direction of a rotor scanner relative to the workpiece, according to at least one example embodiment.

FIG. 10 illustrates a workpiece 1020 in a flat state, as may be patterned in at least some example embodiments.

FIGS. 11A-11K illustrate a plurality of (e.g., eleven) different positions of a writing head in relation to the direction of the rotor scanner relative to the glass. The arrow in FIG. 11 represents the scanning direction.

FIGS. 11A-11C show dense matrices of pixels, for example, images of a rectangular spatial light modulator with the rows and columns of the array aligned with the sides of the rectangle. FIG. 11A illustrates an SLM in which a pixel grid is parallel, or substantially parallel, to the writing direction. FIG. 11B illustrates an SLM pixel grid, which is tilted relative to the writing direction. FIG. 11C illustrates an SLM pixel grid, which is tilted relative to the writing direction, the tilt in FIG. 11C being less than as compared to the tilt of the pixel grid axis in FIG. 11B.

FIGS. 11D-11F show images of a dense matrix with the array rotated relative to the SLM sides, for example, by 0°, 45° and a third angle. The third angle may be an angle other than 0°, 45° or 90°. FIG. 11D illustrates an SLM with a pixel grid slanted 45° with respect to the writing direction. In example embodiments, the pixel grid may not be parallel with the edges of an outer edge of an SLM chip as in FIG. 11A-11C.

In FIG. 11E the SLM chip is shown slanted such that one of the axes in the pixel grid may be parallel, or substantially parallel, to the writing direction.

In FIG. 11F the SLM chip may be slanted so that the neither the outer edge of the SLM chip nor any one of the pixel grid axis are parallel, or substantially parallel, to the writing direction. The axes of the sides of the matrix of pixels (e.g., an SLM) and/or the axes of the pixel grid may be rotated with respect to the axes of movement during writing and/or the axes of the written pattern, thus providing, at least four sets of coordinate directions as will be described below with regard to FIGS. 12B-12D.

FIG. 11G shows a relatively sparse matrix skewed or rotated so that the rows fall at different positions during scanning. In example embodiments, the area may be filled in one or several scans. In FIG. 11G a plurality of laser diodes (e.g., five lines and/or five rows) slanted to the writing direction.

FIG. 11H shows relatively a sparse row of pixels, for example, a plurality of (e.g., three) laser diodes may be arranged orthogonal to the writing direction. If utilizing the example embodiment shown in FIG. 11H, multiple passes may be required to fill a desired area.

FIG. 11I shows a relatively dense row of pixels, for example, an image of a one-dimensional SLM in which a plurality of (e.g., seventeen) laser diodes may orthogonal to the writing direction.

FIGS. 11J and 11K show single rows with the pixels displaced in the scanning direction. FIG. 11J illustrates a plurality of (e.g., twelve) laser diodes in a row slanted to the writing direction. FIG. 11K illustrates a line of a plurality of (e.g., seventeen) laser diodes slanted to the writing direction according to an example embodiment.

A common problem with optically written patterns, as well as with inkjet-printed ones is the formation of "Mura." The formation of Mura refers to the formation of visible bands or patterns due to the visibility of the fields or stripes and/or due to moiré effects between the pattern and the writing mechanism. "Mura" is an issue for image devices (displays and cameras) but not for other laser-written patterns such as PCBs and PCB masks.

At least some example embodiments provide a method for assembling optical fields to a display pattern by repetition along an x and a y axis. The fields may be, for example, SLM fields, an SLM pixel pattern, or an array of pixels formed by another writing mechanism such as an array of diodes.

As discussed above with regard to FIG. 12A, the arrangement according to the conventional art is used in higher-precision pattern generators and may produce acceptable levels of "Mura" defects. However, example embodiments provide writing systems having 10, 100, or even 1,000 times higher throughput than conventional pattern generators, but with essentially the same or substantially the same "Mura" reduction requirements. Higher speed, larger pixels, multiple writing units and/or multiple writing heads, may contribute to more geometrical errors in the written pattern. As will be described in more detail with regard to FIG. 12B-12D, the pattern and the axes of the writing head may be rotated relative to each other, such that a single pixel is not repeatedly printed on the edge of adjacent pixels. Furthermore, the axes between the movement system and the pixel grid created by the writing units may be rotated relative to each other. The pattern may be aligned with the movement axes, the pixel grid or neither. The rotation may be an angle different from 0, 45 and 90°.

As discussed above with regard to FIG. 12A, the rotation direction is parallel to a side of the SLM chip in the conventional art.

FIGS. 12B-12E show example embodiments, which may suppress the occurrence of Mura and/or weaken the effects of Moiré in the pattern. As shown, in example embodiments, the pattern may be rotated relative to the axes of the writing mechanism and/or the movement system (e.g., scanning direction of the SLM).

For example purposes, FIGS. 12B-12E will be described with regard to an SLM pattern. However, similar principles apply to other example embodiments, such as, any suitable writing unit.

Figure 12B:
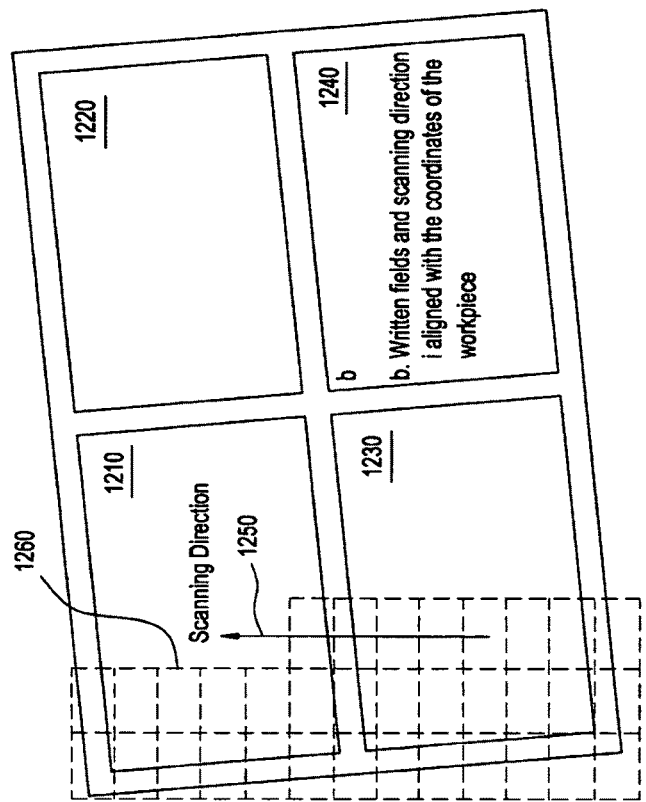

In FIG. 12B, the workpiece may be wrapped onto the workpiece holder, and may not be in parallel with the central axis of the workpiece holder. The SLM, or more generally the writing unit, may be arranged in the rotor scanner with an outer side of the SLM chip, or more generally the axes between the pixels formed in the pattern by the writing unit, in parallel, or substantially parallel, with the scanning direction. For example, the scanning direction and the SLM field are aligned, while the workpiece is rotated relative to the scanning direction and the sides of the SLM pattern. With this rotation of the workpiece, the effect of a stitching artifact no longer accumulate along a single line of the device but will pass from line to line, spreading the disturbance to many lines. In addition, a Moiré pattern, which is really an intermodulation product between frequency components of the pattern and the writing mechanism (e.g. display pixels and laser scanner pixels), may be relocated to a higher frequency that is less visible in the finished display.

Figure 12C:
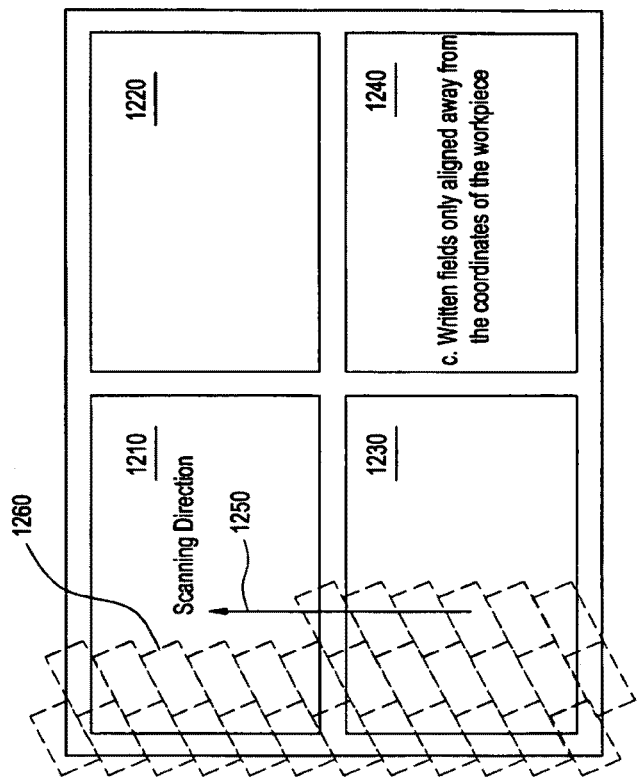

In FIG. 12C the SLM chip, or a similar pixel map formed by the writing units, may be arranged in the rotor scanner with at least coordinate axes non-parallel to the rotational direction. The workpieces may be arranged with an axis of symmetry in parallel to the central axis of the workpiece holder.

In FIG. 12D all three coordinate systems are non-parallel to each other. Together with FIG. 11 it is possible to define four coordinate systems, which may be rotated relative to each other. Two, three or four coordinate systems may be made oblique relative to each other in order to reduce "Mura" effects, while all four parallel defines the prior art.

Figure 12E:
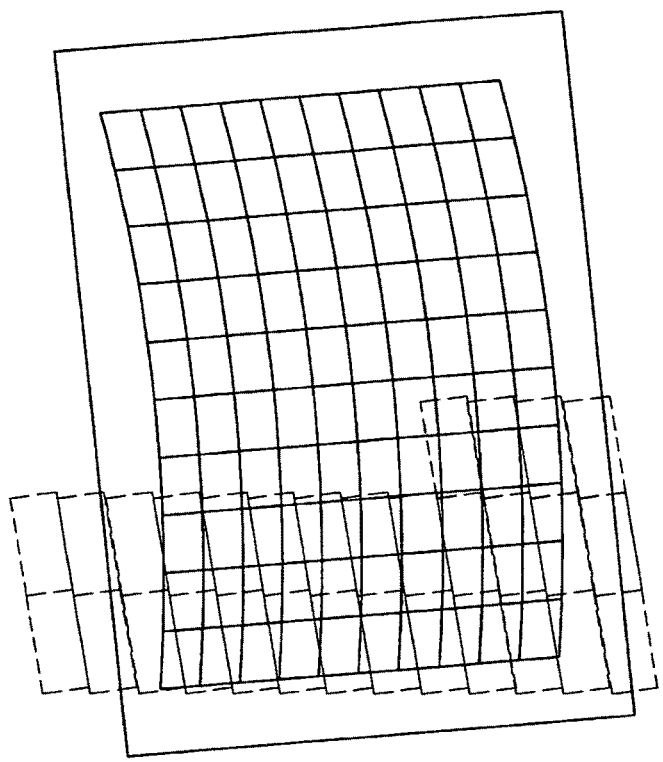

In FIG. 12E, the workpiece is rotated, the writing SLM field is rotated and intentional distortion is introduced.

An angle between the sides of the SLM pattern and the workpiece for reducing Mura effects may be greater than or equal to about 0.01 radians (e.g., between about 0.01 and about 0.05 radians, inclusive). The angle used, however, may depend on the write mechanism, scale and/or type of the pattern. The angle may be adjustable from one writing job to the next, or on the other hand, fixed and built into the writing hardware.

FIGS. 24A-E illustrate methods for continuous scanning in the x and y directions, according to an example embodiment.

Figure 24C:
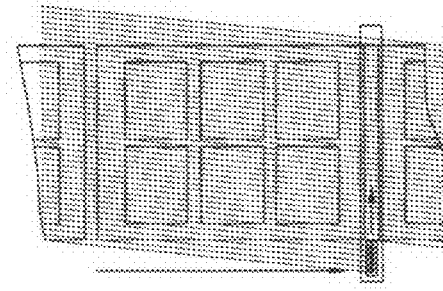
FIGS. 24A-E illustrate methods for continuous scanning in the x and y directions, according to an example embodiment.
Figure 24B:
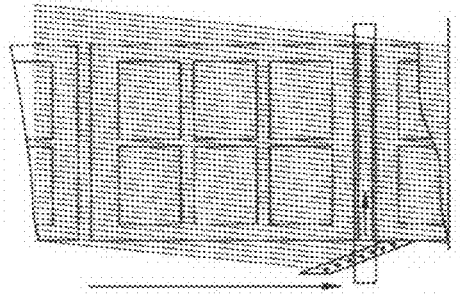
Figure 24A:
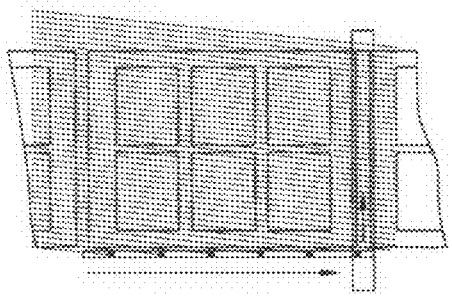

FIG. 24A shows an array of pixels in the x-direction along the tool axis. The array may move with a constant speed and after the cylinder rotates one turn, the array stitches to the printed pattern. If the array is not sufficiently dense, the scanning speed may be reduced to, for example, half so that two turns are needed to move the width of the array. The scanning speed may also be reduced more or less depending on the density of the array. The array may be parallel or not parallel to the tool axis.

FIG. 24B shows another method for patterning, according to an example embodiment, in which the array is not parallel to the tool axis.

In FIG. 24C, an array parallel to the y-axis of the workpiece and perpendicular to the tool axis. In this example embodiment, the surface of the workpiece is patterned by continuous scanning in the x and y directions.

Figure 24E:
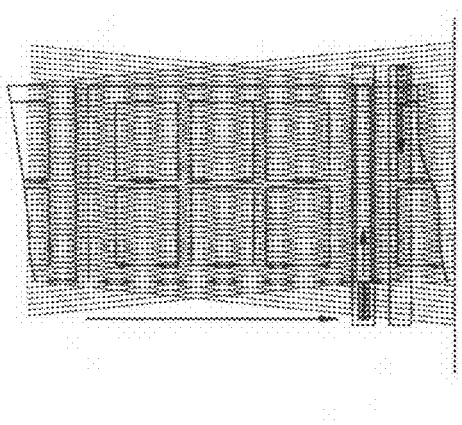
Figure 24D:
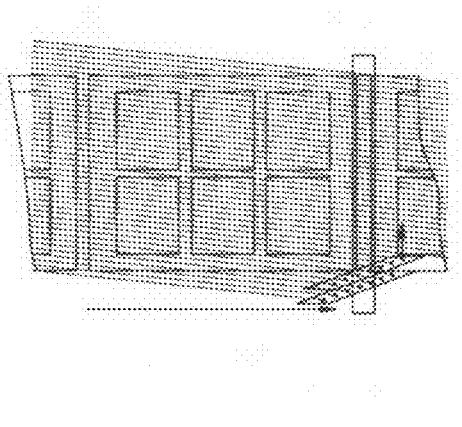

FIG. 24D shows an example embodiment in which an array is less dense then those illustrated in FIGS. 24A-24C. In this example, a second array is needed to fill voids in the less dense array. The second array may be a physical array or the same array in a later pass.

FIG. 24E shows two passes on top of each other. A first of the two passes scans to the right, and a second of the two passes scans to the left. The simultaneous scanning of x and y may provide an oblique angle and the two passes may have opposite angles. This may reduce visibility of resultant stripes. The two passes may be written sequentially with the same pixel array, or with two pixel arrays moving in opposite x-directions, for example, simultaneously. The two pixel arrays may be two physical write heads arranged on two different toolbars. The system shown in, for example, FIG. 25 with continuous scanning in x and reciprocating scanning in y may be used to write two passes in a single operation.

As described above, the oblique writing is possible and indeed natural for a writing system with cylindrical motion. However, oblique writing is also beneficial in flat-bed writers, such as will be described in more detail below.

Figure 22:
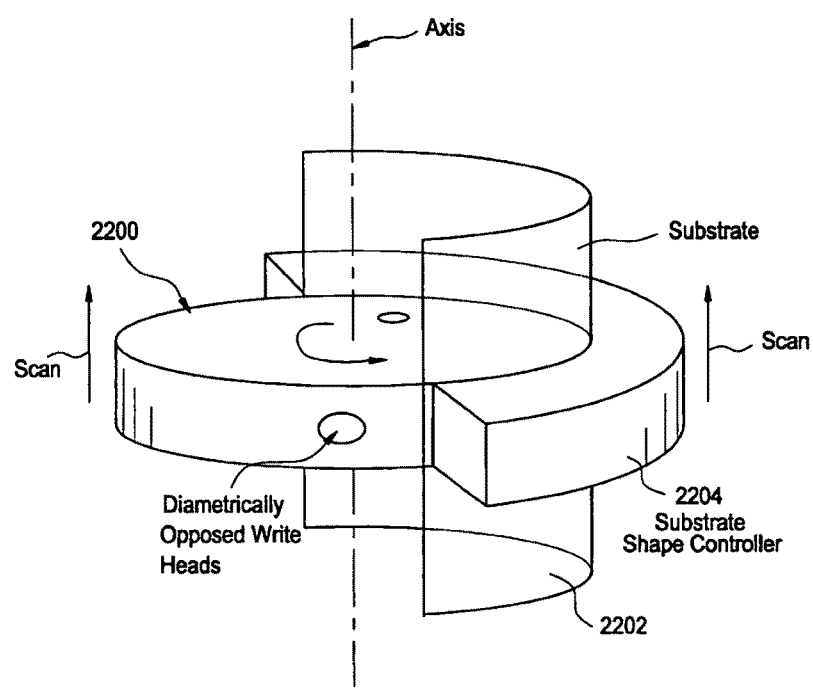
FIG. 22 illustrates a writing apparatus, according to another example embodiment.

FIG. 22 illustrates a writing apparatus, according to another example embodiment. As shown, the writing apparatus may include a rotor scanner 2200 for generating a pattern on a workpiece 2202. The example embodiment shown in FIG. 22 may be similar or substantially similar to the example embodiment shown in, for example, FIGS. 1, 7A, 7B and/or 7C, however, the example embodiment shown in FIG. 22 may further include a workpiece shape controller 2204. The workpiece shape controller 2204 may scan in the same direction as the rotor scanner 2200. In at least one example embodiment, the workpiece shape controller may scan the workpiece 2202 such that the workpiece shape controller 2204 and the rotor scanner stay in constant horizontal alignment.

Figure 15:
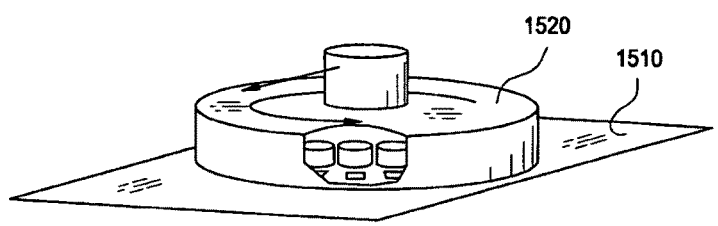
FIG. 15 is a perspective view of a writing apparatus, according to another example embodiment.

FIG. 15 is a perspective view of a writing apparatus, according to another example embodiment. The rotor scanner of FIG. 15 may be used to pattern a flat workpiece, such as the workpiece shown in FIG. 10.

Referring to FIG. 15, the rotor scanner 1520 may include a plurality of optical writing units (not shown) arranged on a flat portion (e.g., a top and/or bottom surface) of the rotor scanner 1520. The plurality of optical writing units may be arranged such that they emit electromagnetic in an axial direction relative to the rotor scanner 150. In at least one example embodiment, the optical writing units may be arranged around the outer edge of the bottom of the rotor scanner 1520. As shown, the rotor scanner 1520 may rotate and/or move along the surface of a workpiece 1510. The width of the rotor scanner 1520 may cover the width of the workpiece 1510. In example embodiments, the rotor scanner may scan the workpiece in a varying direction, and may form a relatively shallow and/or run across the workpiece at an angle such that the arc is not tangent to 0, 45 or 90 degrees. This geometry may be used with thicker and/or non-bendable masks.

Figure 17:
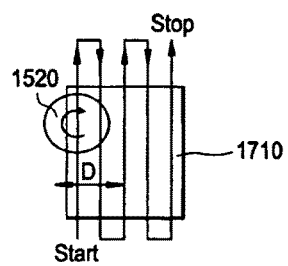
FIG. 17 is a top view of the writing apparatus 1520 shown in FIG. 15.

FIG. 17 is a top view of writing apparatus shown in FIG. 15. Referring to FIG. 17, the diameter D of the rotor scanner 1520 is narrower than the width of the workpiece 1710. In example embodiments, the rotor scanner may track or scan back and forth over the workpiece 1710 so as to cover the entire workpiece 1710. In example embodiments, the rotor scanner 1520 may write continuously regardless of which direction the rotor scanner is moving. In an alternative example embodiment, the rotor scanner may write in a single direction.

Figure 18:
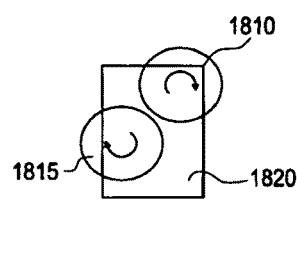
FIG. 18 illustrates a writing apparatus, according to another example embodiment.

FIG. 18 is a top view of a portion of a writing apparatus, according to another example embodiment. The example embodiment of FIG. 18 may be similar or substantially similar to the example embodiment discussed above with regard to FIG. 17, however, the example embodiment of FIG. 18 may include at least two rotor scanners 1810 and 1815. In example embodiments, the rotor scanners 1810 and 1815 may pattern the same workpiece 1820, for example, simultaneously.

Figure 19A:
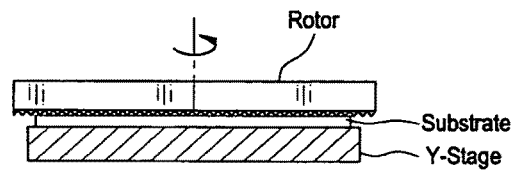
FIG. 19A is a side view of a writing apparatus, according to another example embodiment.
Figure 19B:
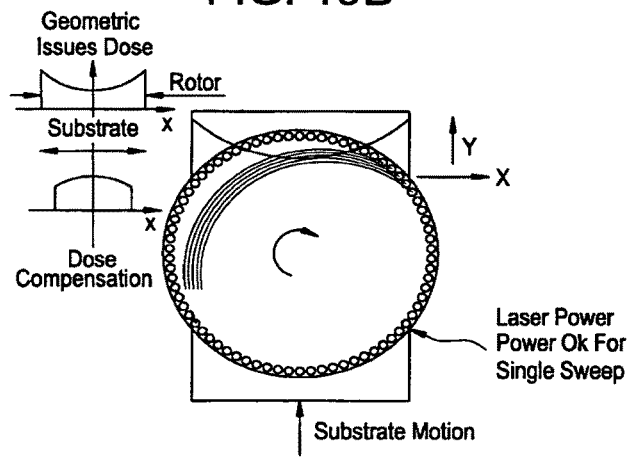
FIG. 19B is a top view of the writing apparatus shown in FIG. 19A.

FIG. 19A illustrates a side view of a rotor scanner according to an example embodiment, and FIG. 19B illustrates a top view of the rotor scanner shown in FIG. 19A. In the example embodiment shown in FIGS. 19A and 19B, the diameter D of the rotor scanner 1520 is greater than the width of the workpiece. The rotor scanner of FIGS. 19A and 19B may track laser diodes at a side of a workpiece in parallel with the workpiece motion. This tracking or scanning illustrated in FIGS. 19A and 19B may result in a higher dose at the sides of the workpiece than the dose in the middle of the workpiece, given that the dose of the laser diodes is the same. This may be compensated for by increasing the dose of the diodes and/or pixels when patterning the center part of the workpiece.

Figure 16:
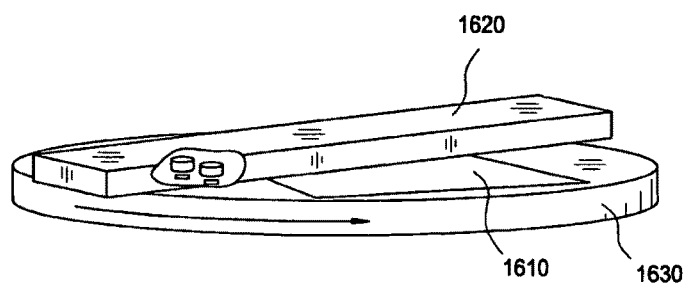
FIG. 16 illustrates a writing apparatus, according to another example embodiment.

FIG. 16 is a perspective view of a writing apparatus, according to another example embodiment.

Referring to FIG. 16, the writing apparatus may include a circular stage 1630 on which a workpiece 1610 may be fixed. A writing head 1620 may be arranged so as to span at least the diameter of the circular stage 1630. The writing head 1620 may include a plurality of optical writing units (not shown) arranged on a surface portion of the writing head, such that electromagnetic radiation emitted by the optical writing heads impinges on the workpiece 1610 during writing. In example operation, the circular stage, and thus, the workpiece 1610 may rotate while the writing head 1620 moves perpendicular to the rotational axis of the circular stage 1610.

Figure 23:
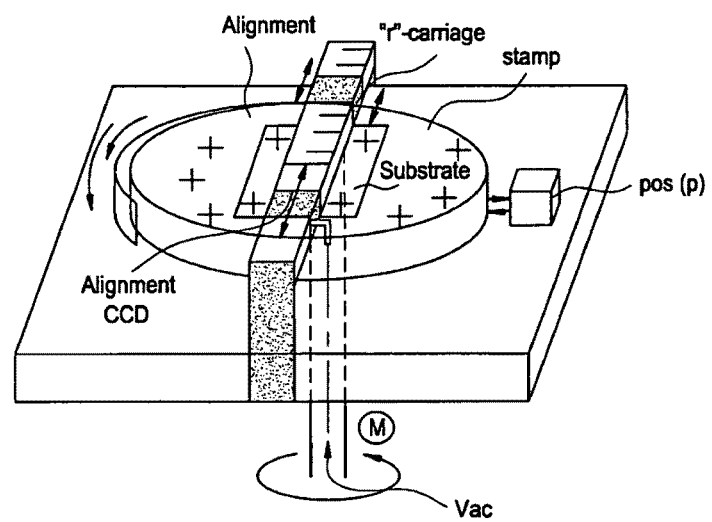
FIG. 23 is a more detailed illustration of the pattern generator shown in FIG. 16.

FIG. 23 is a more detailed illustration of the pattern generator shown in FIG. 16.

Figure 20:
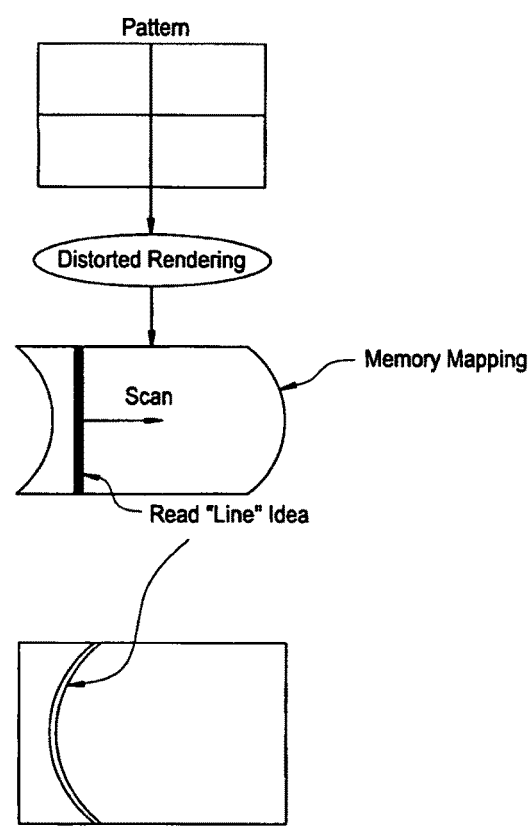
FIG. 20 illustrates a method for transformation of a Cartesian grid into a bent coordinate system, according to an example embodiment.

FIG. 20 illustrates a non-Cartesian coordinate system in a rotor scanner, according to an example embodiment. For example, the coordinate system may be bent. In this example, a memory mapping may be performed before, during or after patterning to transform pixels in the Cartesian grid to pixels in the bent coordinate system defined by the rotating pixels relative to the workpiece. For each circle created by a single pixel in the writing head a transformation may be made from a Cartesian grid into the bent coordinate system FIGS. 25-28 illustrate flatbed platforms, according to example embodiments.

Figure 25:
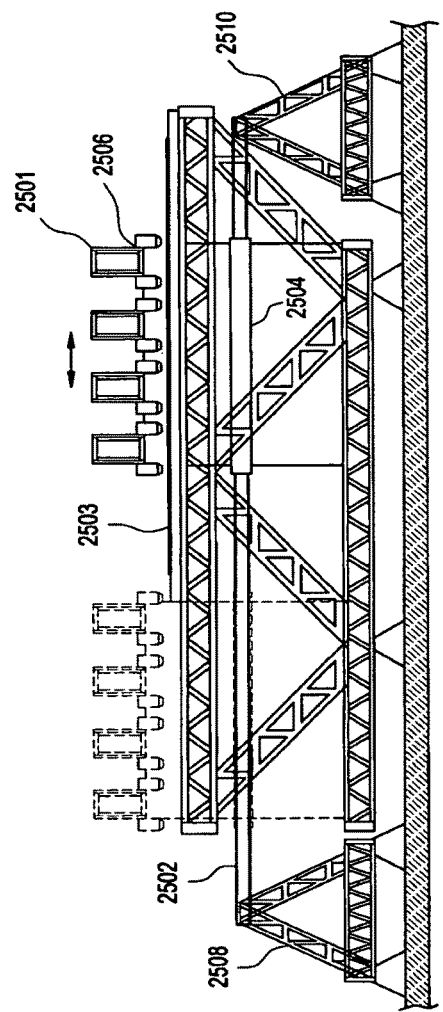
FIGS. 25-28 illustrate flatbed platforms, according to example embodiments.

FIG. 25 illustrates a flatbed platform, according to an example embodiment. The platform shown in FIG. 25 may be a lightweight frame, shown for example purposes as a truss. However, example embodiments may be built with thin walled tubes that may be temperature controlled by fluid (e.g., air, water and/or gas) flowing within the tubes. The frame may provide a more rigid support for a stationary stage top. Writing heads (e.g., mechanical units holding writing optics) may be arranged on mechanical support structures, herein referred to as tool bars, near the surface of the workpiece. At least one toolbar may extend across the stage. Each of the toolbars may include one or more tools (e.g., writing heads). The tools may be mounted or arranged in a similar or substantially similar manner to that as described above with regard to the cylindrical stage. The toolbars may have fixtures or tools (e.g., which may be standardized). The number of toolbars and the tools attached to each toolbar may be configured according to the application and/or need for capacity.

FIG. 25 shows how toolbars 2501 access any point on the workpiece 2503, and how the toolbars may be moved out of the way for loading and unloading. The platform of FIG. 25 may include a linear motor 2504 for driving the toolbar assembly 2506. The linear motor may be attached to a rod 2502 extending between supports 2508 and 2510 standing separately on the floor. A freely moving counter mass (not shown) may be used so that neither part of the linear motor is connected to the ground. The linear motor may move the toolbar assembly 2506 and the counter mass by applying a force there between, while keeping a common, stationary center of gravity.

A separate system including the motor applying a weak force between the ground and the counter mass may keep the counter mass centered within a range of movement.

The moving stage may slide on bearings (e.g., air bearings) and may hold the workpiece using, for example, vacuum, electrostatic force or any other suitable clamping mechanism. The moving stage may more accurately monitor and/or control the position of the stage relative to the coordinate system of the machine. The platform of FIG. 25 may be suitable for many processes, such as, metrology, patterning, etc.

Figure 26:
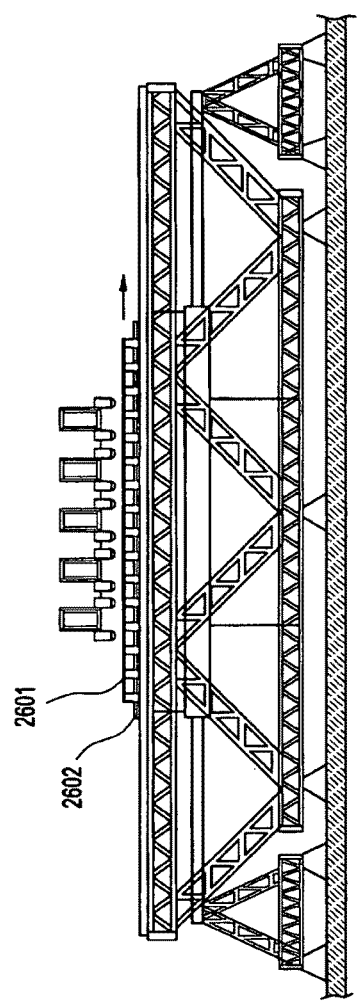

FIG. 26 illustrates a flatbed platform, according to another example embodiment. The example embodiment shown in FIG. 26 may be similar or substantially similar to the flatbed platform of FIG. 25; however, the flatbed platform of FIG. 26 may include a different number of toolbars (e.g., five toolbars) mounted in a fixed position. In this example embodiment, the workpiece 2601 shuttles back and forth on a lightweight shuttle 2602.

Referring to FIG. 26, the stage may be relatively lightweight similar or substantially similar to the shape of the support. The stage may be driven by linear motor and the reaction force from the motor is isolated from the support of the stage either by separate connections to the ground or by a counter mass. The stage may slide on bearings (e.g., air bearings) and may hold the workpiece using vacuum, electrostatic force or any other suitable clamping mechanism.

Figure 27:
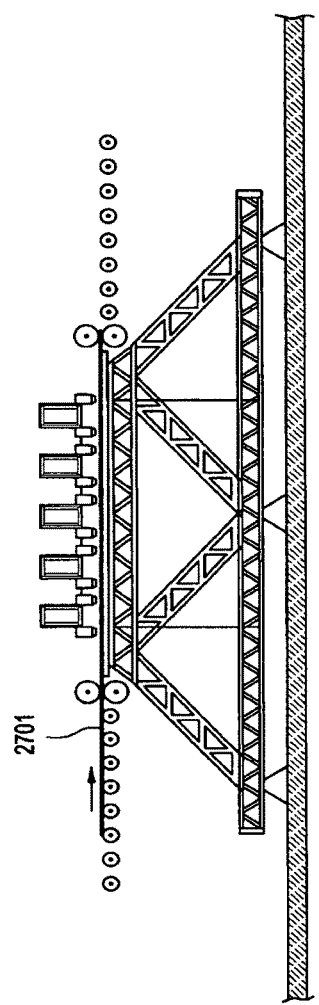

FIG. 27 illustrates another example embodiment in which the workpiece 2701 passes under the tool bars and may be patterned in passing. The workpiece may be in the form of cut sheets or a roll-to-roll endless band. As discussed above, patterning may involve exposure of photoresist, patterning of thermally sensitive resists of films, any photoactivation of the surface, ablation, thermal transfer or any similar processes using reaction to photon energy and/or heat of a light beam. According to at least some example embodiments, light refers to any electromagnetic radiation with a wavelength from EUV (e.g., down to 5 nm) to IR (e.g., up to 20 microns).

Figure 28:
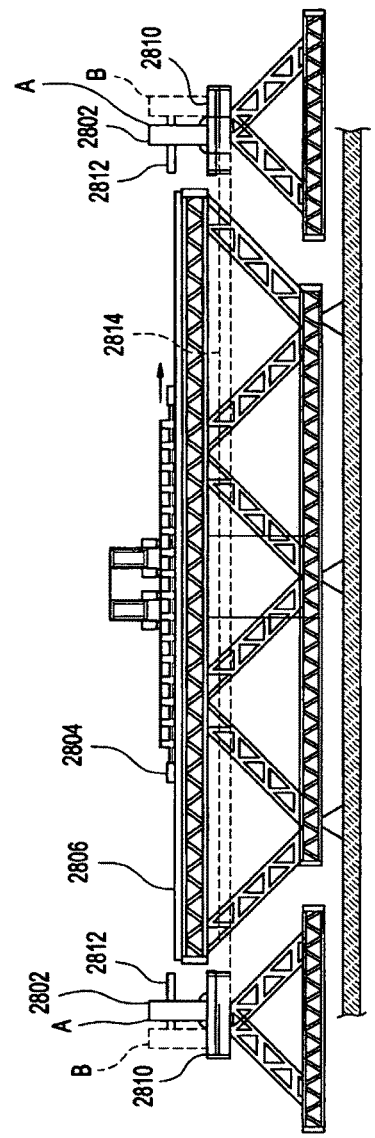

FIG. 28 shows an example operation of a flatbed platform for higher-speed patterning of workpieces, according to an example embodiment. For example purposes, this example operation will be described with regard to FIG. 26; however, other flatbed platforms, according to example embodiments, may operate in similar or substantially similar manners. The platform may have the same or substantially the same type of lightweight board frame and a floating lightweight stage, hereinafter referred to as a "shuttle," 2804.

Referring to FIG. 28, in example operation, the shuttle 2804 may oscillate (e.g., bounce) between counter masses 2802 positioned at each end of the support 2806. The counter masses 2802 may freely move between position A and B via slides 2810, but may be affected by the force of the linear motor. When the shuttle 2804 impacts or hits against a counter mass 2802 the shuttle 2804 loses at least a portion of kinetic energy. The force during the impact may be controlled by spring constants of springs 2812 compressed during the impact. At an end of each stroke, the shuttle 2804 impacts the counter mass 2802. The counter masses 2802 may be joined by a fixed rod 2814 or controlled individually by one or more linear motors.

A linear motor may also be positioned, for example, under the shuttle 2804 and may accelerate the shuttle 2804 toward a first impact when the shuttle 2804 begins moving. The liner motor may also be used to move and stop the shuttle at any position, and/or maintain a constant or substantially constant speed during scanning. The shuttle may operate at a constant speed, moving, for example, to the left or to the right in FIG. 28. The stiffness of the springs 2812 may be selected such that the maximum acceleration is within a desired range, such that the workpiece does not slide on the stage and such that excessive vibrations are not generated in the stage.

In at least some example embodiments, the stage may be comprised of, for example, a leaf spring with pads floating on the support structure and other pads holding the workpiece. With a flexible light-weight shuttle the shape of the stage may be determined by the shape of the supporting surface.

Figure 29:
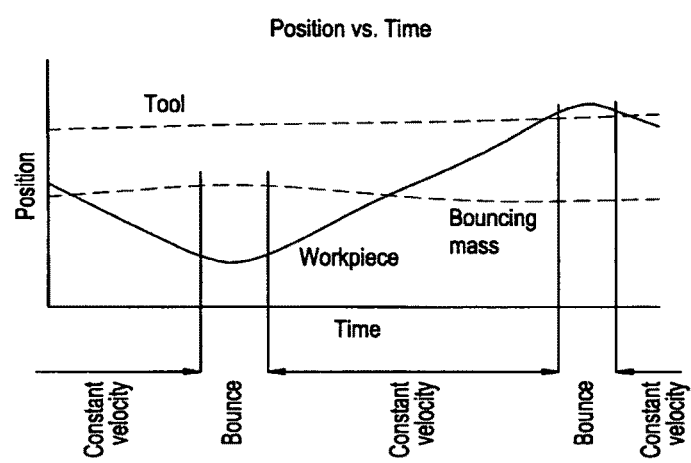
FIG. 29 shows a diagram over the position of the stage and the counter masses during scanning.

FIG. 29 shows a diagram over the position of the stage and the counter masses during scanning. FIG. 29 also shows the position of the tool scanning at a constant speed in the direction perpendicular to the paper. When the stage is scanning to the right an oblique line is traced by the tool across the workpiece and after the bounce and other oblique line is traced with a different angle. With the proper relation between the tool width, the stage speed, and the tool speed two contiguous passes may be written on top of each other. Both passes may have stripes inclined to the scanning axis of the stage which may reduce periodic defects in a pattern as shown.

If the workpiece is about 2.8 m long, accelerating at about 10 g during bounce, and moving at a constant speed of about 6 m/s otherwise, the average scanning speed including bounce-time is approximately 5 m/s. Momentum may be transferred between the counter masses 2802 and the stage, none of which are connected to the supporting structure or to the floor. After the bounce counter mass 2802 recedes with a speed significantly lower than the stage, the linear motor may reduce the speed and reverse the velocity of the counter mass until the next impact with the same counter mass.

If the counter masses 2802 are connected by a rod, or alternatively, if a single counter mass is arranged at the center of the stage is used, the demands on the linear motor may be reduced. In this example, bounces at each end reverse the velocity of the counter mass(es), and the movement of the counter mass may be similar or substantially similar to that of the stage, except slower and with less range.

In one or more example embodiments, patterns may be written on workpieces (e.g., glass sheets, plastic sheets, etc.) used in, for example, electronic display devices such as LCDs. In these example embodiments, a workpiece larger than about 1500 mm may be used. An optical writing head (e.g., a rotor scanner) with a plurality of writing units (e.g., greater than or equal to 5) may be used. A data channel with a data rate (e.g., greater than or equal to 100, 200, 400 Gbits/s, etc.) may provide data, and the workpiece and the optical writing head (or rotor scanner) may be rotated relative to one another in at least one direction. The workpiece and the writing head may also be moved relative to one another in a plane, for example, between 45 and 135 degrees relative to the plane of rotation. For example, in at least one example embodiment, the plane of rotation may be perpendicular to the plane of movement.

Although example embodiments have been described with regard to workpieces, it will be understood that workpieces may be used interchangeably with workpiece. In addition, writing apparatuses, according to example embodiments, may be used in conjunction with conventional pattern generation systems.

According to at least some example embodiments, the written pattern is not sub-divided into stripes. In at least some example embodiments with non-interfering pixels (e.g., FIG. 1 and FIGS. 11G-11K) an image may be built from parallel lines extending from one side of the workpiece to the other.

In some example embodiments, (e.g., FIG. 1), the lines may be written from edge to edge and in sequence by the writing units. Two adjacent lines may be written by two adjacent writing units thereby reducing (e.g., minimizing) the risk of the workpiece and/or writing head moving by drift and/or mechanical movement from one line to the next. The sequentially written edge-to-edge pattern local errors may be reduced and "Mura" effects may be reduced.

In an example embodiment similar to FIG. 1, but including more than one ring of writing units (e.g., FIG. 7A) or with an arrangement of writing units or non-interfering pixels as shown, for example, in FIG. 11G-11K the lines may not be sequentially written. However, with multiple writing units distributed around the perimeter of the cylinder, two adjacent lines may still be written by writing units in proximity to one another on the perimeter of the writing head (e.g., within 90° from each other and in relatively close time proximity). In addition, multiple writing units distributed around the perimeter of the cylinder may still limit the freedom for drift and/or vibration between the lines.

In example embodiments using SLMs to form simultaneously contiguous arrays of pixels (e.g., one-dimensional (1D or two-dimensional (2D)) adjacent arrays may be written sequentially and/or in close proximity in time, thereby reducing the stitching areas between the pixel arrays (SLM stamps). Helical scanning with multiple writing units, together with the calibration of writing units against the same calibration sensor, may reduce mismatch between the images from the writing units, whether the images are single points, clusters of non-interfering pixels or dense areas of pixels (SLM stamps).

As shown in FIG. 1B, lines traced by the writing units may be oblique relative to the workpiece. This can be corrected if the workpiece is rotated on its support. However, as described above, obliqueness may be used to reduce "Mura" effects, and thus, an increase in the obliqueness of the traced lines may be desirable. A pixel pattern is defined by the scan lines and may be rotated relative to the axes of the pattern, for example, the pixel pattern of the display devices.

A third coordinate system is defined by the movement of the writing head and the rotation/shuttle movement. If the oblique angle between the pixel grid is changed by rotation of the workpiece on the cylindrical support, all three coordinate systems are rotated relative to each other. In other example embodiments only two of the three coordinate systems are oblique to each other.

FIG. 1C illustrates images created by an SLM during scanning. As shown, the images in FIG. 1C are also rotated relative to the workpiece. As discussed in relation to, for example, FIGS. 11A-11K and/or FIGS. 12A-12E, in this example embodiment, four coordinate systems exist and two, three or all four may be rotated relative to each other to reduce "Mura" effects in the written pattern. Reduction of "mura" by rotation of the various coordinates systems may be used while scanning either cylindrically or in a flat-bed stage. In the circular stages shown in FIG. 15 and/or FIG. 16 the coordinate system of the movements rotate during the stroke from edge-to-edge thus creating a local but non-constant rotation between the coordinate systems.

The helical scanning may be implemented by rotating the workpiece, the writing head, or both, and the workpiece can be inside or outside of the writing head.

While example embodiments have been described with reference to the example embodiments illustrated in the drawings, it is understood that these example embodiments are intended in an illustrative rather than in a limiting sense. It is contemplated that modifications and combinations will readily occur to those skilled in the art, which modifications and combinations will be within the spirit of the present invention and the scope of the following claims.

We claim:

1. A photolithography apparatus for patterning at least one workpiece, the apparatus comprising:
   a cylindrical holder for holding the at least one workpiece; and
   a rotor scanner for patterning the at least one workpiece, the rotor scanner including at least two writing units, wherein
      the rotor scanner is configured to move in an axial direction relative to the cylindrical holder and, concurrently with movement in the axial direction, rotate on an axis when patterning the at least one workpiece, the axis of rotation being substantially parallel to the axial movement of the rotor scanner,
      the rotor scanner is one of ring and disc-shaped, and
      the rotor scanner is configured to rotate relative to the cylindrical holder.

2. The apparatus of claim 1, wherein the cylindrical holder holds the at least one workpiece, and the scanner creates a helical pattern on the at least one workpiece by emitting electromagnetic radiation in an outward radial direction.

3. The apparatus of claim 1, wherein the rotor scanner is ring-shaped and configured to create a helical pattern on the at least one workpiece by emitting electromagnetic radiation in an inward radial direction.

4. The apparatus of claim 3, wherein the cylindrical holder further includes air bearings for supporting the ring-shaped rotor scanner.

5. The apparatus of claim 1, wherein the at least two writing units are single-point lasers.

6. The apparatus of claim 1, wherein the at least two writing units are multi-point lasers.

7. The apparatus of claim 1, wherein the at least two writing units are spatial light modulators.

8. The pattern generator of claim 1, wherein the cylindrical holder is stationary.

9. The apparatus of claim 1, wherein the at least two writing units are arranged in at least one row on an outer surface of the cylinder.

10. The apparatus of claim 1, wherein the at least two writing units are arranged in at least one row on an inner surface of the cylinder.

11. The apparatus of claim 1, wherein each of the at least two optical writing units emits electromagnetic radiation in a different radial direction.

12. A photolithography apparatus for patterning at least one workpiece, the apparatus comprising:
    a cylindrical holder for holding the at least one workpiece; and
    a rotor scanner for patterning the at least one workpiece, the rotor scanner including at least one writing unit, each of the at least one writing unit including a spatial light modulator, the rotor scanner being configured to move in an axial direction relative to the cylindrical holder and configured to, concurrently with movement in the axial direction, rotate on an axis when patterning the at least one workpiece, a plane in which the rotor scanner rotates being substantially perpendicular to the axial direction, and the rotor scanner being configured to rotate relative to the cylindrical holder; wherein
       the rotor scanner is one of disc and ring shaped.

13. The apparatus of claim 12, wherein the spatial light modulator includes between about 1,000 and about 1,000,000 elements, inclusive.

14. The apparatus of claim 12, wherein the rotor scanner is configured to generate a pattern in a non-Cartesian coordinate system on the workpiece.

* * * * *